United States Patent [19]

Sager et al.

[11] 4,342,084
[45] Jul. 27, 1982

[54] MAIN STORAGE VALIDATION MEANS

[75] Inventors: Gordon S. Sager, Salt Point; Arthur J. Sutton, Cold Spring, both of N.Y.

[73] Assignee: International Business Machines Corporation, Armonk, N.Y.

[21] Appl. No.: 176,827

[22] Filed: Aug. 11, 1980

[51] Int. Cl.³ .................... G06F 11/10; G11C 29/00
[52] U.S. Cl. .................................. 364/200; 371/10; 371/21; 371/38
[58] Field of Search ............... 371/5, 10, 21, 25, 38; 364/200, 900

[56] References Cited

U.S. PATENT DOCUMENTS

| | | | |
|---|---|---|---|
| 3,387,276 | 6/1968 | Reichow | 364/200 |
| 3,737,870 | 6/1973 | Carter et al. | 364/200 |
| 3,999,051 | 12/1976 | Petschauer | 371/38 |

OTHER PUBLICATIONS

Sager and Sutton, System Correction of Alpha-Particle-Induced Uncorrectable Error Conditions, IBM Technical Discl. Bulletin, vol. 23, No. 9, Feb. 1981, pp. 4225-4227.

*Primary Examiner*—Charles E. Atkinson
*Attorney, Agent, or Firm*—Bernard M. Goldman

[57] ABSTRACT

Method and means for validating any BSM in main storage while main storage remains available for normal system operation by all CPUs in the system. The system has plural sets of BSMs in which any set can be operationally fenced from system operation in order to validate any BSM in the fenced set, while the system normally operates with the unfenced set(s) of BSMs comprising main storage. Each BSM set has a BSM controller which is integrated with a hardware BSM tester. All cells in and the addressing circuits to any BSM can be tested by incrementing line addresses through the BSM while comparing a true pattern and then a complement pattern, and then decrementing line addresses through the BSM comparing the complement pattern and then the true pattern. The BSM testers use level sensitive scan design (LSSD) circuits in the BSM controller to serially communicate with a system service processor in response to commands from the service processor and interrupt signals from the BSM tester. A marker mask in each BSM tester permits BSM testing continuity after each interrupt signal. Between commands, the BSM tester can operate automatically and in parallel with the service processor.

22 Claims, 23 Drawing Figures

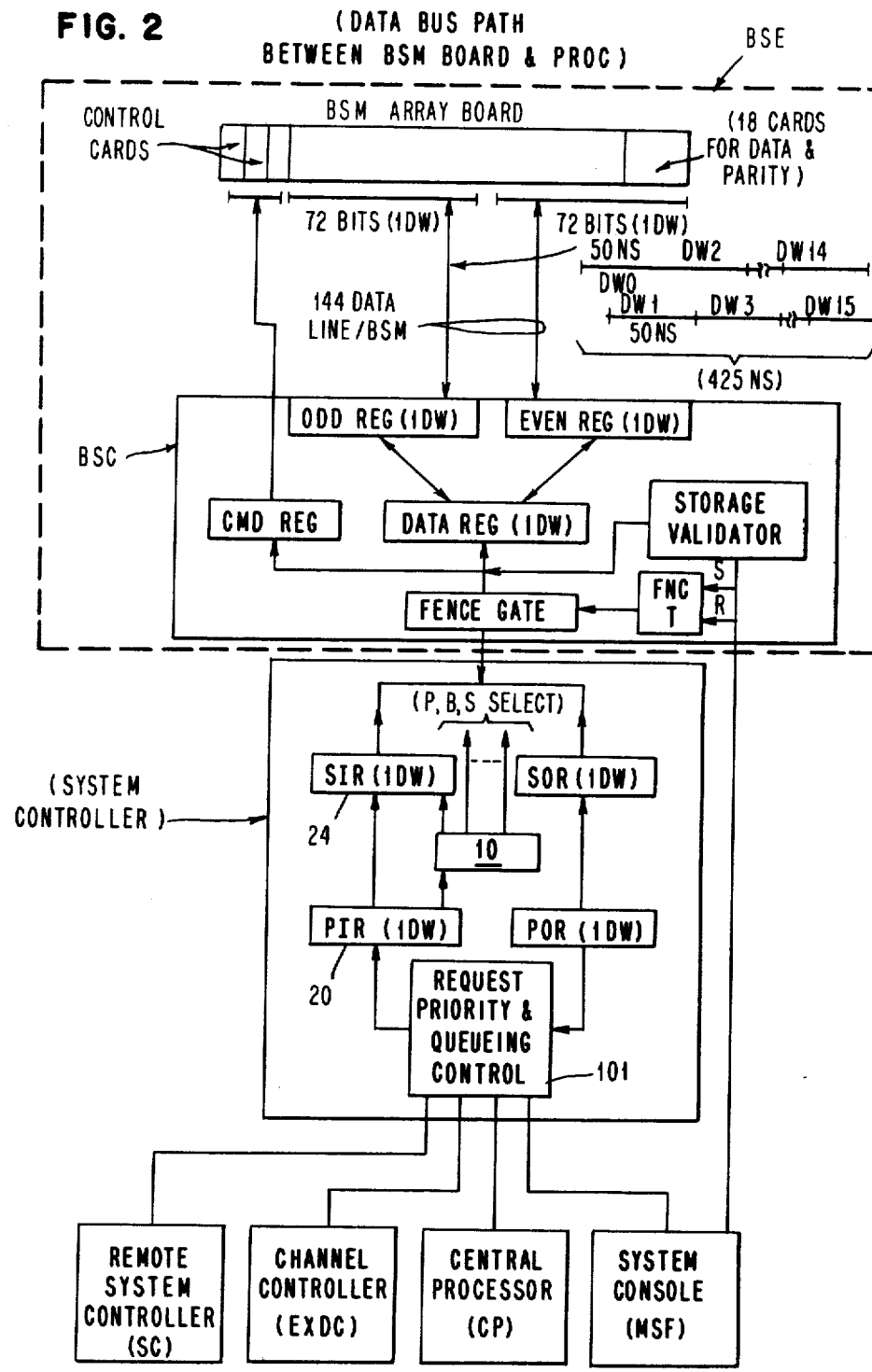
FIG. 2 (DATA BUS PATH BETWEEN BSM BOARD & PROC)

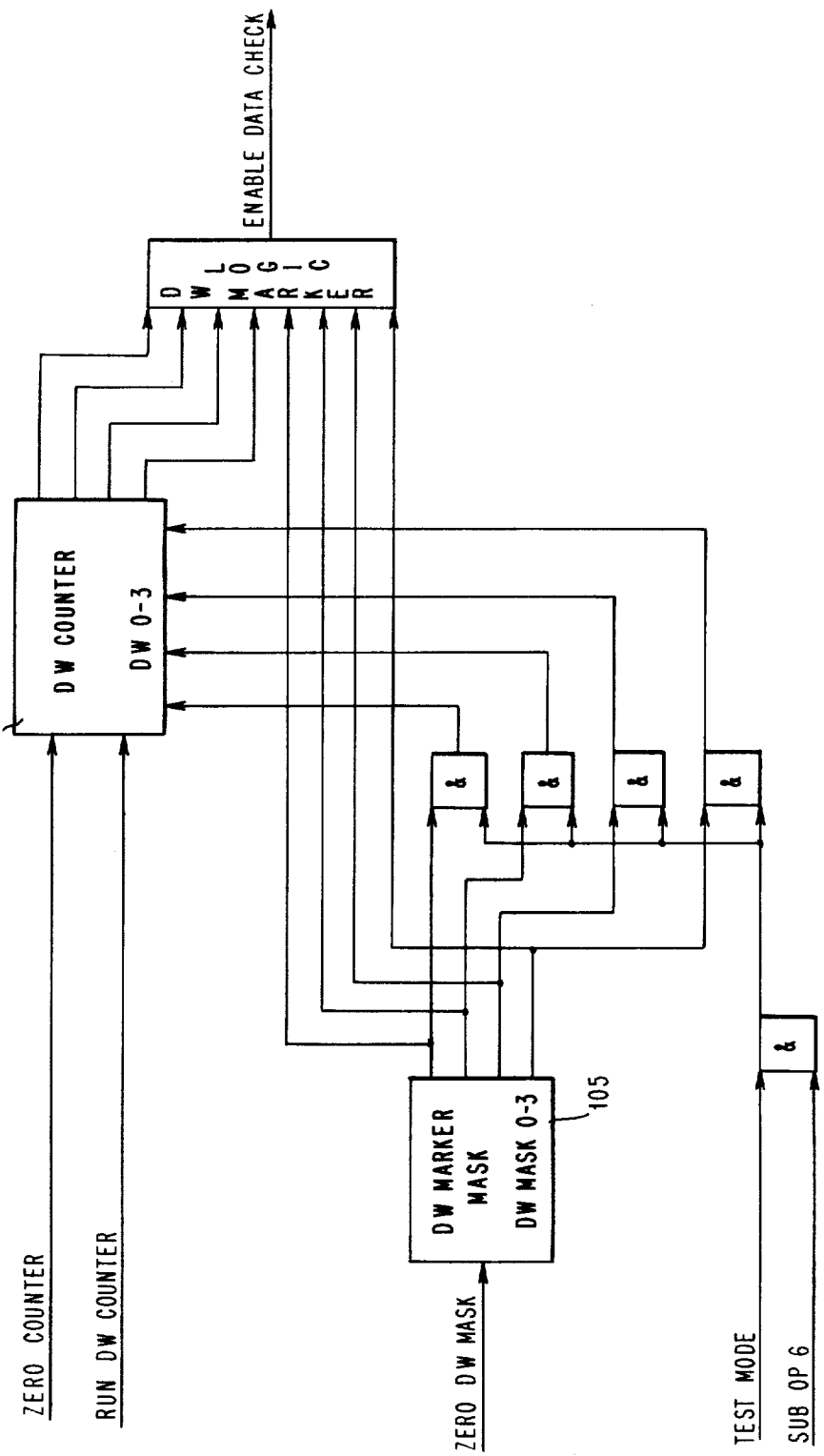

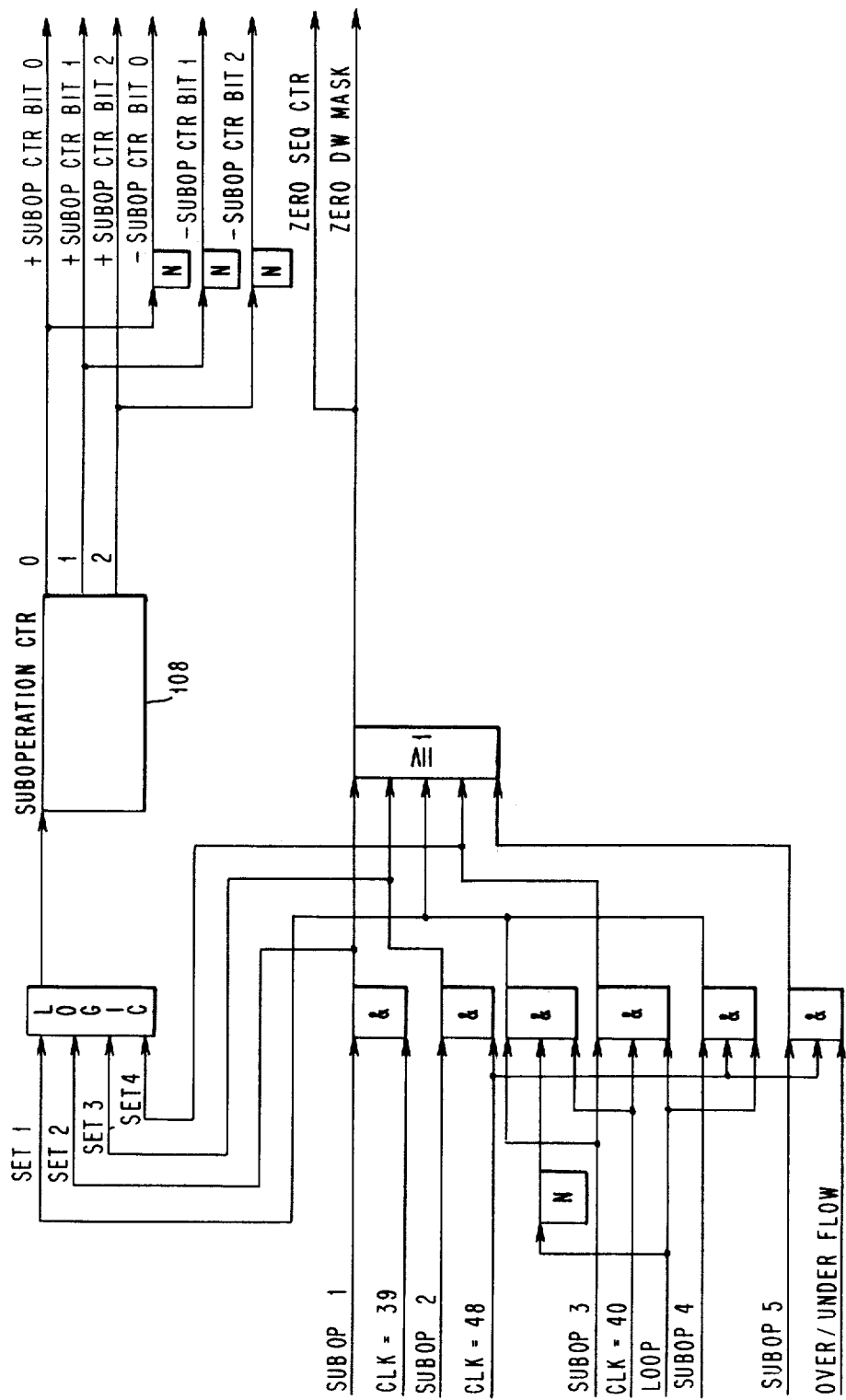

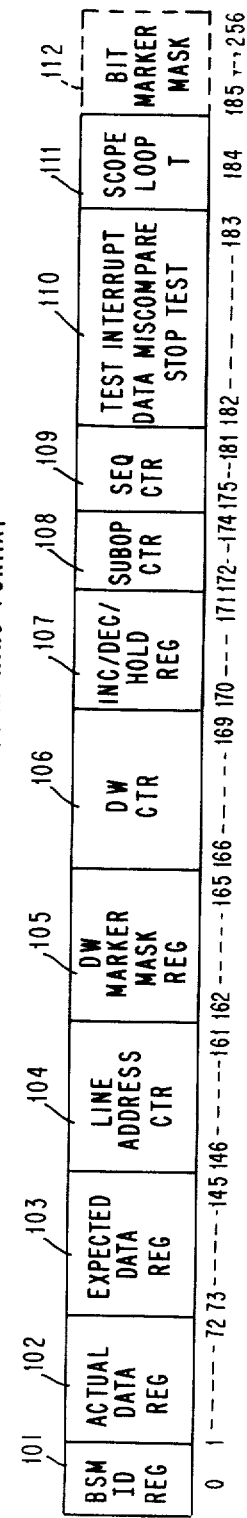
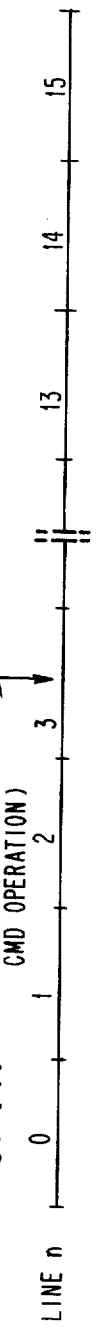
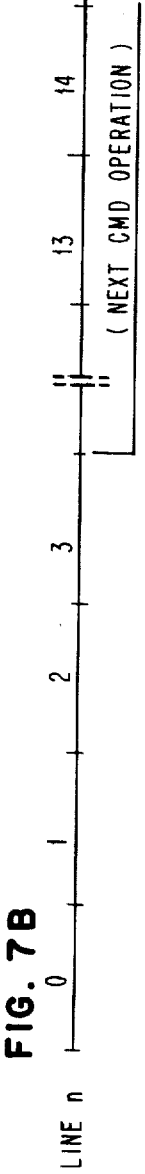

MAIN STORAGE VALIDATION MEANS

INTRODUCTION

This invention relates to the validation of the operational state of the cells in and the addressing circuits for basic storage modules (BSMs) in the main storage of a data processing system.

PRIOR ART

The prior art for testing the cells in the main storage within a data processing system generally falls into two categories: (1) using a central processor in the system to execute a diagnostic testing program, and (2) manually connecting an external testing device to a part of main storage to test the validity of its cells. Each of these categories suffers from substantial adverse characteristics in certain types of systems.

About 1960, it was common to test core storage by running diagnostic programs which wrote various bit patterns in the word locations in storage, such as by (1) writing into each word the address of the word, reading each word, and comparing the read data to the word address, or (2) writing various repetitive bit patterns, e.g. 101..., or 1010..., into each word, reading every word in storage, and comparing it to the expected bit pattern.

Large pipelined cache-oriented processors have a special problem of not being able to directly test and validate their main storage. Such processor does not normally access its main storage; it instead accesses a storage cache (i.e. high speed buffer). Thus with a store-in cache, the processor does not normally access main storage for fetches or stores; and with a store-thru cache, the processor does not normally access main storage for fetches. Hence, the cache must be bypassed for the processor to most efficiently test and validate main storage, which causes BSM testing to operate much slower than the normal processor operating rate, e.g. the cache bypass must access main storage for a double word per access, rather than the normal cache line (e.g. block) access, e.g. 16 double words at a time. Therefore, a special diagnostic CPU instruction must be provided which bypasses the normal cache operation for improving the efficiency of BSM testing. If only a uniprocessor (UP) exists in a system, normal job handling is completely stopped while the storage diagnostics are executing. When the diagnostics are run by a processor in a multiprocessing (MP) system, the system loses a corresponding proportion of its normal job handling speed, e.g. ½ speed loss in a two-way MP.

Also large MPs have system controllers (or storage controllers) in the path between the CPUs and main storage which control the physical addressability of main storage by the CPUs and may prevent independent testing of any given BSM by any assigned CPU. That is, shared addressability by plural CPUs to a BSM under test permits interference by an unassigned CPU during the test, which destroys the integrity of a BSM test.

If an external hardware testing device is used, the data processing system must be totally disrupted by shutting it down while the testing machine is manually connected to a part of the main storage.

If the miniprocessor (commonly used as the system service processor in the system console) is used to test a large BSM by means of its diagnostic test program, such test takes an undesirably long period of time due to the slow operation of the service processor, in relation to normal CPU speed and due to the necessity for interrupting a BSM test to permit the service processor to perform its required system functions for the normally operating remainder of the system.

Exemplary of prior art which may be pertinent to diagnostic monitoring functions in or for a data processing system, but which does not provide means for fast BSM testing simultaneous with normal CPU operation using a BSM validator integrally contained in each independently testable set of BSMs (which may include as few as one BSM per set) is noted in the following U.S. Pat. Nos.: 3,311,890 (Waaben); 3,336,579 (Heymann); 3,579,199 (Anderson et al); 3,898,621 (Zelinski et al); 3,921,142 (Bryant et al); 3,988,718 (Filloux); 4,010,450 (Porter et al); 4,021,783 (Highberger); 4,051,460 (Yamada et al); 4,057,847 (Lowell et al); 4,078,529 (Soulsby et al); 4,084,262 (Lloyd et al); 4,099,253 (Dooley, Jr.); 4,128,881 (Yamamoto et al); 4,153,946 (Upton); and 4,165,533 (Jonsson).

In machines using recent large scale integration (LSI) technology, it is very difficult (and in some cases impossible) to provide sufficient circuit module terminals (i.e. I/O pins) to which an external testing machine may be connected. Because of the scarcity of I/O pins, recent LSI technology has incorporated level sensitive scan design (LSSD) which requires that serial I/O signals be used to interrogate such LSI circuits, e.g. for diagnostic purposes. Such LSSD technology is disclosed and claimed in U.S. Pat. Nos. 3,761,697; 3,783,254; 3,784,907; 4,051,352; 4,063,178; 4,063,080 and the patents cited in these patents to Eichelberger et al and assigned to the same assignee as the subject invention. Serial scan signals are very slow and time consuming (in relation to the speed of the normal parallel operation internally within the LSI circuits), and therefore scan testing can be slow and time consuming if very large numbers of circuits are to be tested. LSSD circuits may be used selectively throughout a system, where LSSD speed is compatible with diagnostic requirements, such as in a BSM controller. But LSSD is preferably not used in the main storage itself in which there may be hundreds of millions of bit cells to be tested, because LSSD testing of a large BSM would be exceedingly slow, and for other reasons BSMs are preferably not made of LSSD technology. New BSM technology uses very few I/O pins in the very small package comprising the circuit chips used to make a BSM in the random access main storage of a data processing system. For example, a circuit chip in a BSM may have 64,000 cells with only 16 I/O pins (and not include LSSD). As with any man-made device, it is possible for failure to occur at any time in any one or more of the bit positions along the millions of bit positions in a BSM.

SUMMARY OF THE INVENTION

It is an object of this invention to validate any BSM in the system without at any time stopping the data processing system for the purpose of performing the BSM validation and without requiring the use of any CPU in the validation process.

It is a further object of this invention to automatically validate the useable parts of the BSM at a faster rate than with any prior art BSM tester.

It is another object of this invention to enable the validation of the errorless or error-correctable bit cells of a BSM, as well as the uncorrectable bit cells in the BSM.

It is still another object of this invention to permit the use of a console processor to control the testing of all bit positions in a BSM without using any CPU in the data processing system, so that all CPUs in the system may continue normal processing with one or more other BSM(s) in the system.

It is a still further object of this invention to provide a storage tester and validator which utilizes a LSSD serial diagnostic interface of a BSM controller to a service processor programmed entity to communicate test commands for the storage tester and validator associated with the BSM controller to test a BSM which need not be constructed of LSSD technology.

It is another object of the invention to provide a BSM validator which operates autonomously of the data processing system and its service processor, whereby the validator only requires commands from the service processor at the times of initiation and completion of a BSM test, and upon occurrance of any error indication during the BSM test.

It is still another object of this invention to provide marker mask hardware in a BSM validation means which is used automatically during a BSM test by a controlling service processor to maintain interruption continuity for the validation process when the BSM validation means must momentarily stop the BSM testing and communicate a detected failed BSM cell to the service processor, whereby the detected failed area is marked by the mask hardware on the next service processor command to continue the BSM test from the last detected failed area.

It is a further object of this invention to provide marker mask hardware in a BSM validation means which operates with a storage line fetch by permitting the validation process to skip the portion of a line which has previously been tested and determined to have an error.

It is a still further object of this invention to provide a BSM tester and validator which enables a scope display of bad cells within a BSM.

It is another object of this invention to provide a hardware tester that can detect faults in BSM addressing circuits as well as cell failures within the BSM.

A feature of this invention permits storage validation hardware to be an integral part of each of plural BSM controllers to test any BSM in any BSM set controlled by a respective BSM controller. Each BSM set contains one or more BSMs. The validation hardware may be controlled by a service processor at a slow rate while the validation hardware performs BSM testing at a high rate. That is, the service processor may initiate the storage validation hardware and receive its results; but the service processor is available to do unrelated work between such initiation and results, during which time the service processor need not remain operationally connected to the storage validation hardware. The service processor may be a relatively slow miniprocessor of the type currently found in data processing system consoles. This invention uses the normal data transfer pins on the BSM chips to test its cells. Nevertheless, the invention can use the serial LSSD pin(s) in the BSM controller to communicate test commands from a service processor to control a selected BSM validation.

Another feature of this invention provides means for fencing each BSM set from the system storage controls. The storage controls are also connected to at least one other BSM set that is not simultaneously fenced so that at least one other BSM set can be used by the one or more CPUs in the system for normal system operation while any BSM in a fenced BSM set is being tested by integral BSM validation means. A service processor controls the initiation and release of the fencing process and provides all communication with the fenced BSM set. Before the fencing process can be initiated, the data processing system must first transfer all data in the BSM to be tested to an I/O device or to another BSM which is to remain in normal system operation. (See an article published in the February 1980 IBM Technical Disclosure Bulletin, page 4140 entitled "Storage Control for Bad Data From A Central Processor" by B. L. McGilvray et al.) After the data is copied from the BSM to be isolated, the fencing operation is initiated by the service processor, after which the validation hardware operation is initiated on the fenced BSM under control of service processor commands. The time to commence the fencing process is chosen by the user so that the user can control when the system performance will be degraded by the logical removal, possibly followed by physical removal, of the BSM from operating main storage. While the testing and validation of the fenced BSM is being performed, the remainder of the data processing system may be normally operating; and the only system performance penalty is the temporary reduction in main storage size by the amount of the fenced BSM(s).

Still another feature of this invention involves having power boundaries around each system hardware set of one or more BSMs associated with each BSM validation hardware unit, so that any BSM set can have its power removed without removing power on the other BSM set(s) in the system. Thus, normal operation of the system can continue with the other BSM set(s), while the BSM(s) without power can be handled by humans without danger of electrical injury, wherein the humans can replace any field replaceable BSM array board, module, or chip, or repair it. Sometimes swapping the locations of two field replaceable units between or within an BSM can change a UE to a correctable error by changing the physical location of erroneous bit cells among the error correctable units (ECC units) so that every ECC unit in the BSM is correctable. A removed BSM field replaceable unit can thereafter be repaired at a more convenient time at more convenient facilities, if repair is advisable. Replacement is preferable to repairing the BSM within the system, since replacement can be done more quickly; after which power can be restored to the changed BSM. Then the changed BSM is retested to assure that it has no UEs. When the BSM validation is completed, the service processor removes the fencing on the validated BSM set, and it is put back into normal system operation.

After fencing is completed in the preferred embodiment, a storage validator (SV) begins BSM testing when the service processor issues a scan-in command to the SV in the fenced BSM controller. The command identifies the fenced BSM to be tested, the type of test to be performed, the address to be tested in the BSM, and provides an expected bit pattern for the test.

When in increment mode, the SV propogates the expected bit pattern (and its complement) through the sequence of line addresses in the BSM. Each addressed line is tested an ECC unit at a time with the ECC function off for the BSM. Each ECC unit is tested at every bit position including its ECC bit positions. (The embodiment uses a double word (DW of 72 bits as its ECC unit.) The expected bit pattern provided by the service processor may be written into every DW in each line, then the line is fetched, and each DW compared to the expected bit pattern. While still addressing the line, it is again written by using the complement of the expected bit pattern which is tested in the same manner. Then the line address is incremented to the next line which is tested by the same bit pattern and its complement until the entire BSM is addressed and tested, leaving a complement test pattern when there is no error. Then the SV is put into decrement mode in which the direction of line address sequencing is reversed, and the complement of the original pattern is now used as the expected bit pattern to again test the entire BSM in the same manner but by decrementing the line addresses. Upon the completion of bidirectional testing, the complement of the complement bit pattern is stored to leave the BSM with the originally stored bit pattern if there is no error. Other bit patterns may be provided by the service processor and tested in the same manner by sequencing the bit pattern and its complement through the entire BSM in both directions. The incremented true bit pattern detects forward addressing errors, while the decremented complement bit pattern detects backward addressing errors. Any bit pattern miscompare may detect a cell failure.

During any test, whenever an error is detected in any ECC unit (i.e. by an unequal compare of expected and actual bit patterns), the SV momentarily stops generating an interrupt signal to the service processor, which then signals a scan-out command to the SV to send the unequal actual and expected bit patterns having the error, along with the other pertinent information to the service processor. It then automatically reissues the validation command with the address of the erroneous DW, which the SV sets into a marker mask register so that the testing continues from the erroneous ECC unit in the currently addressed line. Then in parallel with the continued BSM testing, the service processor can determine the location of each error bit in each erroneous ECC unit by comparing the received actual and expected bit patterns previously communicated from the SV. Each determined erroneous bit address is posted in an entry in a BSM validation table in the service processor storage (which is independent from the CPU main storage). The posted entry identifies the tested BSM, the address of each erroneous ECC unit, and the location of each erroneous bit. If any ECC unit is determined to have more erroneous bit position(s) than can be corrected by the ECC, the ECC unit is marked with the uncorrectable error (UE) flag. The service processor can also determine likely addressing circuit errors when it finds an ECC unit has the complement of the expected pattern.

When all testing sequences on the fenced BSM(s) are completed, the service processor accesses the BSM validation table and determines which erroneous DWs have more than one erroneous bit, and each erroneous DW is marked as uncorrectable (UE) (e.g. for a BSM using double error detection with single error correction for each double word) or as correctable (CE) if it has only one erroneous bit. Then the service processor determines the identification of which field replaceable unit(s) in the BSM have UEs. Finally, the service processor displays a message at the system console identifying the failing field replaceable unit(s).

Therefore a validated BSM does not necessarily mean that it does not contain any bad bit cell (when error correction is provided for the stored data in the BSM). For example, if each DW is provided with single error correction, double error detection (by means well known in the prior art), then up to one bad bit position is allowed in each DW without that DW having any UE, because its one bit error is corrected. If more than one bad bit occurs in any DW, it then continues a UE and the page frame having a bad DW is not used by the system.

The initiation of a BSM test occurs in the following manner; During normal system operation of a BSM, if a BSM detects a UE, it generates a machine check interrupt signal with an interrupt code which indicates the reason for the interrupt. Both a CPU and the service processor receive each BSM UE interrupt signal. The service processor counts the number of UEs signalled for each BSM. The UE count value is posted by a service processor program into a special maintenance table for each BSM in the service processor storage. The service processor program then compares the error count for each BSM to a previously entered threshold count value, and whenever the threshold value is exceeded, the service processor calls a display program to display a message on the console to advance the system operator to schedule maintenance, whenever convenient, on the BSM having the excessive number of UEs, so that the BSM can have its erroneous parts replaced or repaired. Thus the system maintenance may then be scheduled and performed when the system is in minimum use, such as during a weekend or after the busy daytime operating shift.

The CPU receiving a UE machine check interrupt signal also uses the information to automatically correct its use of that BSM as follows: The CPU determines the UE page frame address from the received signal. The CPU then executes the real storage manager program in the operating system to invalidate the system page table entry addressing the page with the UE, so that no page table entry thereafter has a real address to any erroneous page frame. The BSM then continues to be used with fewer page frames as UEs are detected, until the performance of the BSM is degraded to the threshold at which the validation procedure is requested to verify the error conditions in the BSM, which may lead to the replacement or swapping of identified BSM field replaceable units.

These and other objects, features and advantages of the invention may be more fully understood and appreciated by considering the following detailed description in association with the accompanying drawings.

DESCRIPTION OF THE DRAWINGS

FIG. 2 illustrates the relationship between basic storage module (BSM) array boards, a BSM controller (BSC) and a system controller (SC) as they connect in a uniprocessor system.

FIGS. 5A, 5B, 5C, 5D, 5E, 5F, 5G, 5H, 5I and 5J illustrate detailed circuitry in the storage validation embodiment shown in block diagram in FIG. 3A.

FIG. 6A shows the format for data shifted into and out of the registers and counters in the LSSD scan ring in the SV shown in FIG. 3B in response to commands from the service processor (MSF). FIG. 6B shows the scan ring input data format received from the MSF when the SV receives an input command from the MSF. FIG. 6C shows the output data format provided from the scan ring in FIG. 3B to the MSF when the SV receives an output command from the MSF.

FIG. 7A illustrates an example of the end of one command operation in relation to a BSM line containing sixteen doublewords having an uncorrectable error (UE) in the third doubleword. FIG. 7B illustrates an example of the beginning of the next command operation in the same line as determined by uses of the mask marker register.

DESCRIPTION OF THE PREFERRED EMBODIMENT

Figure 1:
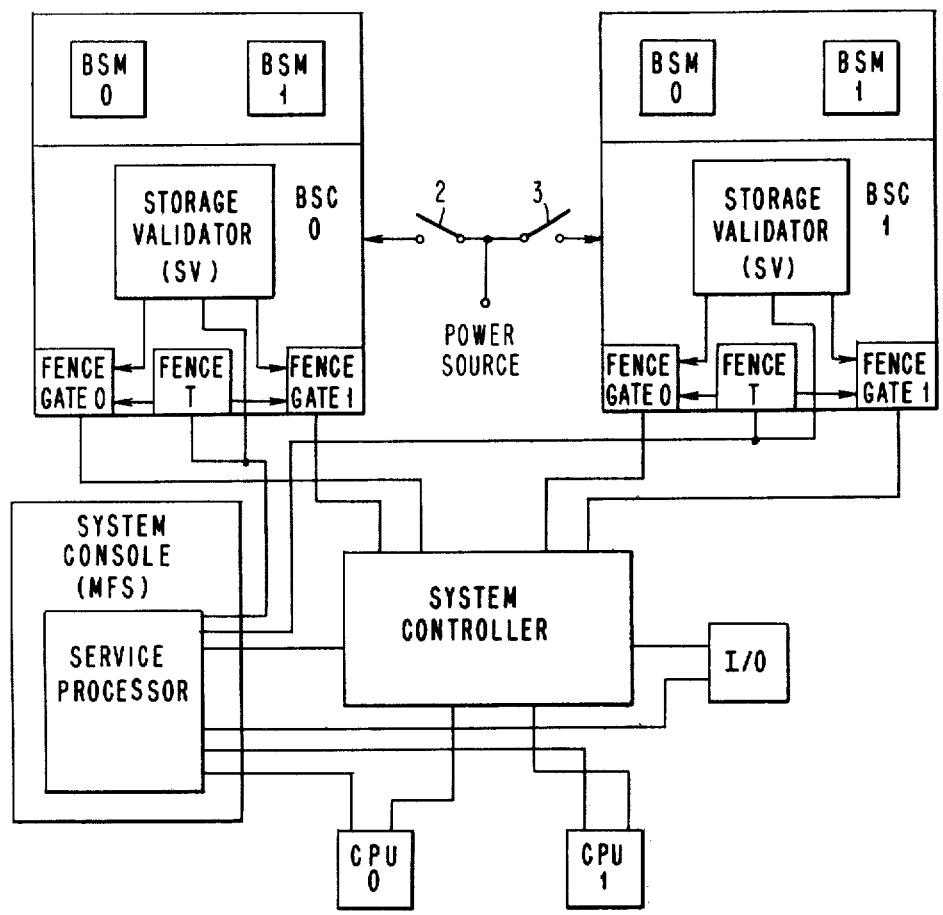
FIG. 1 illustrates a multiprocessing system containing the invention.

FIG. 1 illustrates a multiprocessor system which contains the subject invention. It includes a system controller (SC) which connects CPU0 and CPU1 to main storage comprising two BSM controllers BSC0 and BSC 1, each connecting to a set of BSM's in which each set has two BSM's 0 and 1. The first BSM set is controlled by BSC0 and the second BSM set is controlled by BSC1. A storage validator (SV) is integrated within the package of each BSC and uses the data paths through the BSC to each BSM.

The interface from each BSC to the system controller (SC) can be operationally enabled or disabled by means of fence gates 0 and 1 in each BSC. All communications between the BSC and the SC is provided through the fence gates.

A fence trigger (T) is provided in each BSC which has an output that controls the disablement state of both fence gates associated with the BSC. The fence trigger is set by the service processor whenever the service processor must isolate a BSM set (BSM0 and BSM1) from the normal operation of the data processing system. The fence trigger is also reset by the MSF whenever the BSM set is to be returned to normal operation in the data processing system.

Thus, when the fence trigger T is set, there is no communication of either data or commands from the SC to the BSM's in the isolated data set, which prevents either CPU0 or CPU1 or any I/O device from transferring data or commands to any BSM in the isolated set.

While the BSM set is isolated from normal operation from the data processing system, the storage validator can communicate with either BSM in the isolated set and a service processor (MSF) in a system console can communicate commands to any fenced BSM.

Each BSC and its two BSM's receive all power through a respective power switching controller 2 or 3 in FIG. 1. When either power switching controller is opened, all power is removed from the respective BSC and its BSM set, so that it is then safe for humans to touch its component parts. Each of the other major parts of the system also have their respective power switching controllers (not shown) such as CPUs 0 and 1, etc. so that they can be separately removed from the system while permitting the remaining part of the system to operate.

FIG. 2A illustrates in more detail the interface between the BSC and the SC through a fence gate in the BSC. Only a single BSM array board is shown connected to the BSC in FIG. 2, and is representative of the plurality of array boards which comprise each BSM.

Figure 4A:
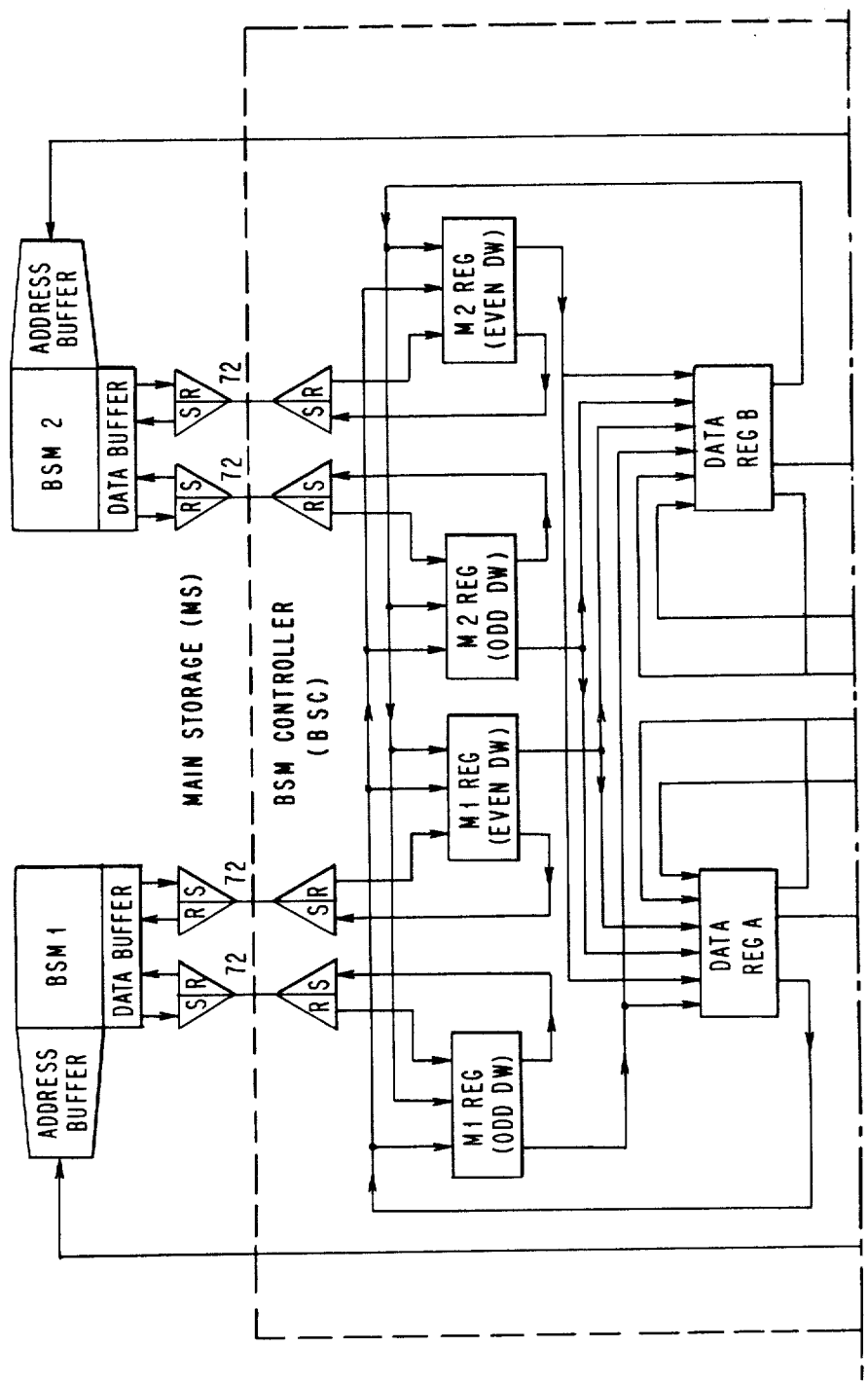
FIGS. 4A and 4B show a more detailed block diagram of the BSM controller used in the preferred embodiment of the subject invention.
Figure 4B:
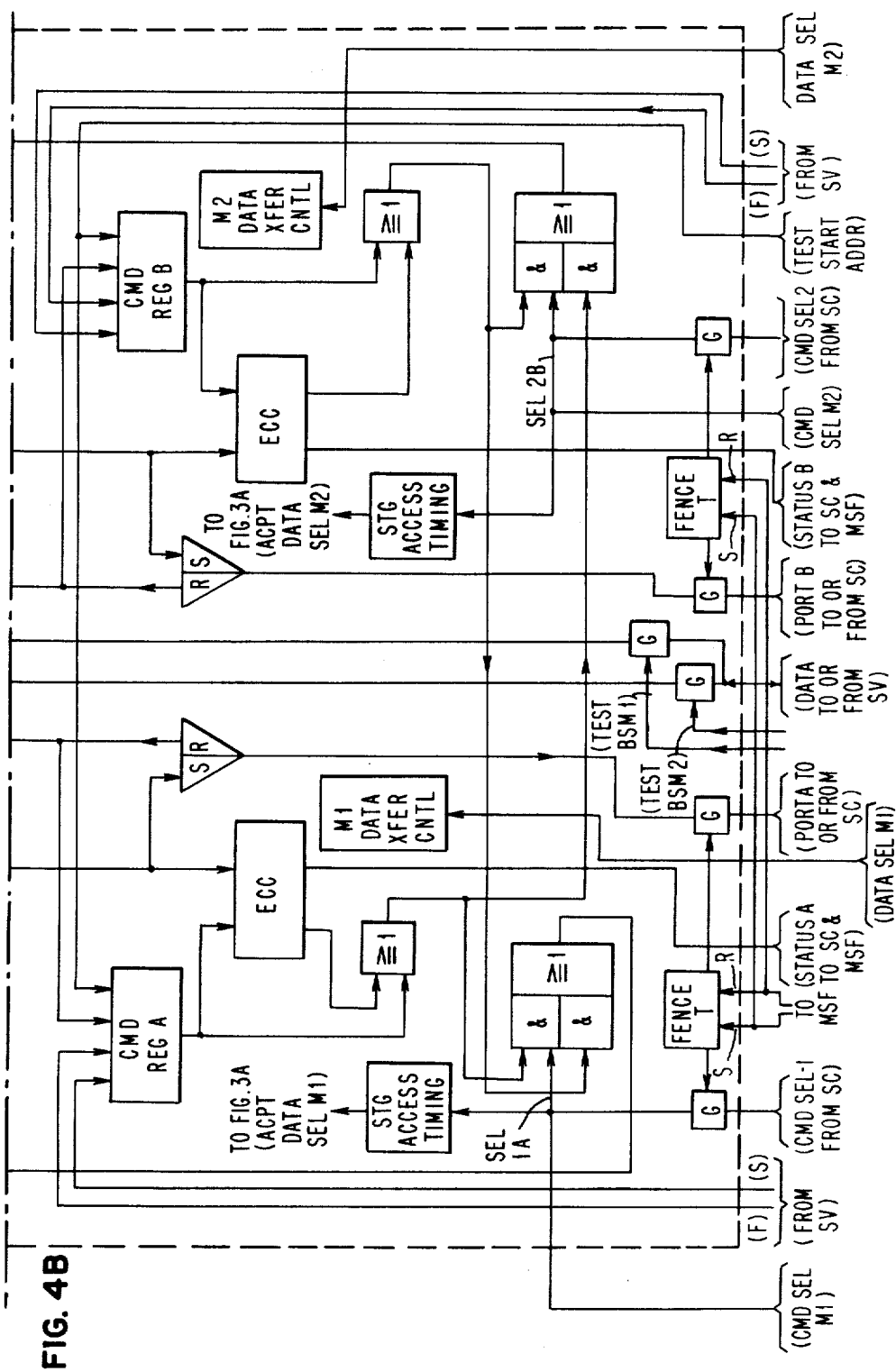

FIGS. 4A and 4B show in still more detail the internal data paths of the system controller with the fence gates and fence triggers. Reference is made to U.S.A. patent application Ser. No.: 973,446; Filed: Dec. 26, 1978 (Docket PO9-76-011) to K. G. Tan and assigned to the same assignee of the subject application for a more detailed explanation of some operations of the system controller (BSC).

Figure 3B:
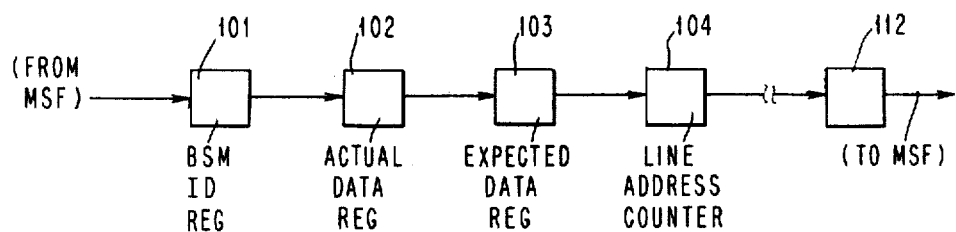
FIG. 3B illustrates how specified registers and counters in FIG. 3A are connected serially together to form a level sensitive scan design (LSSD) type of scan ring for receiving and providing scan-in/scan-out data on command from the MSF.
Figure 3A:
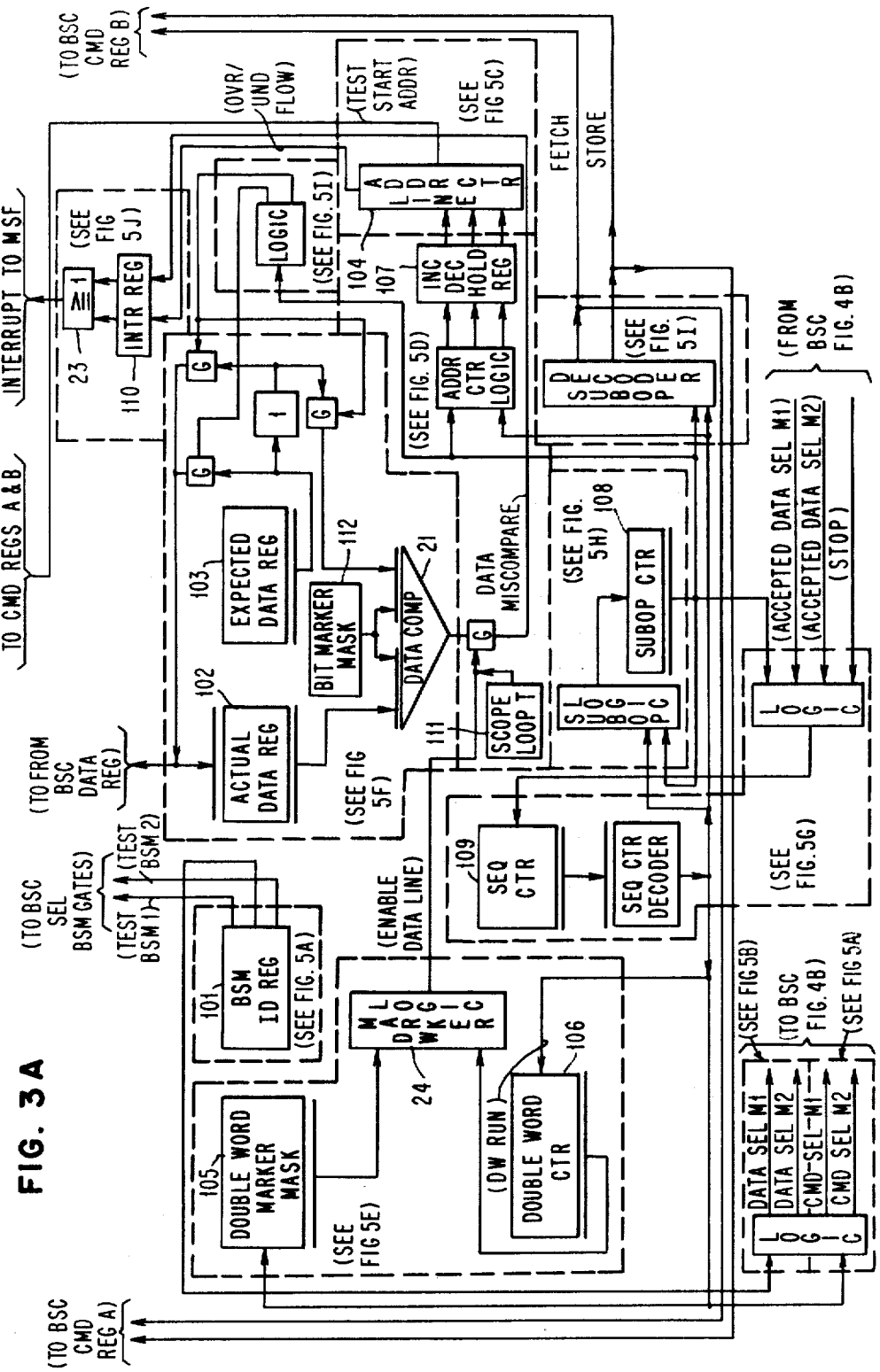
FIG. 3A is a block diagram of storage validation (SV) hardware provided in each BSC in the preferred embodiment of this invention.

FIG. 3A illustrates a detailed block diagram of the internals of each storage validator (SV) and how it connects to its associated BSC fence gates.

FIG. 3B illustrates how registers and counters 101 through 112 shown in FIG. 3A are serially connected by LSSD technology (previously defined by the Eichelberger patents cited in this specification) to form a scan ring. Registers and counters 101 through 112 are serially connected to the LSSD bus to receive input from the MSF and provide output to the MSF on command from the MSF by shifting data bits into the scan ring from the MSF bus or shifting data out of the scan ring to the MSF bus. When registers 101 through 112 are connected in the manner shown in FIG. 3B, they are called a scan ring because of the serial nature of the transfer of data from the MSF to the scan ring or from the scan ring to the MSF depending on whether a scan-in command or scan-out command is received from the MSF. FIG. 6A illustrates the format of data in the scan ring for both scan-in and scan-out command communication with the MSF. FIG. 6B illustrates the scan-in format of data received by the scan ring from the MSF and indicates that register 102, counter 109, and interrupt triggers 110 receive only zeroes. Likewise, FIG. 6C illustrates the output format of data provided from the scan ring to the MSF and indicates that register 105 and counter 109 do not provide meaningful data on the scan-out during which their outputs are forced to be all zeroes.

FIG. 3A is divided into dashed line areas which respectively represent the indicated FIGS. 5A through 5J which show the detailed logic in the SV. The detailed logic content in FIGS. 5A-5J is considered self-explanatory to a man skilled in the art in view of the following explanation.

SUBOPERATIONS BY A STORAGE VALIDATOR (SV)

Before the start of testing a designated BSM, an MSF scan-in command to the BSC of the designated BSM sets the fence around the BSC to isolate it and its BSMs from the system controller and thereby from the rest of the normally operating system. If the BSM to be tested and its BSM controller are not properly fenced before the storage validator (SV) testing starts, extraneous errors can occur and no reliable test can be made.

Individual SV sub-operations are controlled by the respective settings of suboperation counter 108 (see FIGS. 3A and 5H). Suboperation logic circuits control the input to suboperation counter 108 to determine whether the counter performs only one suboperation or provides a sequence of suboperations. Incrementing through a controlled sequence of count states in the suboperations counter 108 permits a predetermined group of SV suboperations to be invoked automatically by a single command from the MSF to the SV.

Six SV suboperations are respectively determined by six count states of suboperation counter 108, as follows:

Suboperation 0—Test Operation Off (a) Suboperation counter state 0 indicates that validation testing is off for the respective SV to permit normal main storage operation for the associated BSC and its BSMs, as long as they are not fenced.

Suboperation 1—Compare True Test

State 1 should be preceded by state 5 which initializes the entire BSM. Then a scan-in command sets counter 108 to state 1, marker mask register 105 to zero; line counter 104 to zero, and doubleword counter 106 to zero. Suboperation 1 proceeds as follows:

(a) Fetches sequentially each double word in the current line address.

(b) Compares each received content of the actual data register fetched from each line with the bit pattern in the expected data register.

(c) If no miscompare (i.e. unequal compare) occurs when the end of each line is reached during the BSM scan, the marker mask register 105 is set to zero and the suboperation counter 108 is set to state 2 to initiate suboperation 2.

(d) If a miscompare occurs in comparator 21 (and the double word address in counter 106 is greater than or equal to the content in the marker mask), the output comparator 21 is gated to set a data miscompare trigger (T) in interrupt register 110, and stops the test sequence with the then existing content of registers and counters 101-112. An MSF scan-out command then finds the BSM ID register 101 contains the BSM identification, the line address counter 104 contains the current line address; the double word counter 106 contains the address of the failed double word causing the miscompare; and the actual double word fetched and the expected double word are in the actual data register 103 respectively. This scanned out is shown in FIG. 6C.

(e) After any miscompare and its interrupt signal to the MSF, the MSF resends the scan-in command with the same data as the last scan-in command, except that the DW mark mask register 105 is set to the DW address in which the failure was last detected. The DW counter 106 is again set to zero so that it again causes all DWs to be read into the actual data register 102 and compared in comparator 21 to the content in the expected data register 103. However, the output of DW marker logic 24 degates the output of comparator 21 until the DW after the address in the marker mask 105) so that no DW tested by the last command (causing the last interrupt) can cause any interrupt during execution of the current command until gating enablement begins after the mark mask DW address.

Suboperation 2—Store Complement (a) The complement of the bit pattern in expected data register 103 is transmitted through gate 32 to every double word in the line currently addressed by the line address counter 104.

(b) Suboperation counter 108 is set to state 3 to initiate suboperation 3.

Suboperation 3—Compare Complement Test (a) Double word (DW) counter 106 is set to zero so that the first DW in the line is addressed.

(b) Fetch sequentially into the actual data register 102 each double word in the line address supplied by the line address counter 104.

(c) Compare the data in each fetched double word in the register 102 with the complement bit pattern in the expected data register 103.

(d) If no miscompare occurs and either the increment or decrement mode is indicated in the increment/decrement/hold register 107, the line address counter 104 is incremented or decremented respectively to the next line address, the double word (DW) marker mask and the DW counter 106 are set to zero, and suboperation counter 108 is set to suboperation 1. But, if overflow or underflow occurs, set the stop test and test interrupt triggers in interrupt register 110, and SV operation stops.

(e) But if no miscompare occurs and the hold mode is contained in the increment/decrement/hold register 107, the double word marker mask register 105 is set to zero, and suboperation counter 108 is set to suboperation 4. (Line counter 104 is not changed.)

(f) If a miscompare occurs in comparator 21 (and the double word address in counter 106 is greater than or equal to the content in the marker mask), the output comparator 21 is gated to set a data miscompare trigger (T) in interrupt register 110, and stops the test sequence with the then existing content of registers and counters 101-112. An MSF scan-out command then finds the BSM ID register 101 contains the BSM identification, the line address counter 104 contains the current line address; the double word counter 106 contains the address of the failed double word causing the miscompare; and the actual double word fetched and the expected double word are in the actual data register 103 respectively. This scan out is shown in FIG. 6C.

(e) After any miscompare and its interrupt signal to the MSF, the MSF resends the scan-in command with the same data as the last scan-in command, except that the DW mark mask register 105 is set to the DW address in which the failure was last detected. The DW counter 106 is again set to zero so that it again causes all DWs to be read into the actual data register 102 and compared in comparator 21 to the content in the expected data register 103. However, the output of DW marker logic 24 degates the output of comparator 21 until the DW after the address in the marker mask 105) so that no DW tested by the last command (causing the last interrupt) can cause any interrupt during execution of the current command until gating enablement begins after the mark mask DW address.

Suboperation 4—Store True Test (Hold Mode)

(a) The true (T) data in the expected data register 103 is transmitted through gate 31 and is stored by the BSC into each double word in the line address counter 104.

(b) The suboperation counter 108 is set to suboperation 1 in order to repeat the sequence at the current line address (determined by suboperation 3, (d)).

Suboperation 5—Test Initialization of BSM

Initialization of a BSM is done by Suboperation 5 before testing begins on the BSM, as follows:

(a) The contents of the expected data register 103 are received from an MSF scan-in command which sets the suboperation counter 108 to state 5. Then each double word of the line currently addressed by the line address counter 104 has stored into it via gate 31 the true value in register 103.

(b) If increment or decrement mode is contained in register 107, the line address counter 104 is correspondingly incremented or decremented. Then step (a) in Suboperation 5 is initiated for the next line.

(c) Whenever the line address counter 108 overflows or underflows, it outputs a signal that sets the test interrupt and stop test triggers (FIG. 5J) in interrupt register 110 (FIG. 3A) and the SV stops operating.

Suboperation 6—One Double Word Test Initialization

Suboperation 6 permits any single double word in a BSM to be set to any value, such as when particular double word is singled out for special testing. An MSF scan-in command sets the required bit pattern into register 103, sets into the marker mask 105 the address of the double word to receive the pattern, and sets suboperation counter 108 to state 6. Then the SV operates as follows:

(a) The true content of the expected data register 103 is stored into the double word specified by the double word marker mask register 105 and the line address counter 104.

(b) The test interrupt and stop test triggers in interrupt register 110 are set, the SV sends an interrupt signal to the MSF, and the SV stops operating. (Note: Only one double word in the BSM is changed during Suboperation 6, which permits different bit patterns to be stored in different (DWs in the BSM).

TESTING BY A SV

The initiation of the above described suboperation 1 by an MSF command automatically sequences suboperations 1 through 3 (as described above) into a suboperation group. This group has the ability to test both the BSM cells and the addressing circuits to the BSM.

A BSM test operation generally begins with a MSF scan-in command which requests the SV to execute suboperation 5 to initialize a BSM with a true bit pattern in all double words.

The next MSF scan-in command may request suboperation 1 in increment or decrement mode, which causes the SV to execute suboperations 1 through 3 as a operation group on every line in the BSM. In this example, mode register 107 is set by the command to increment mode, and the SV will begin at line 0 and test line after line until it has either (a) encountered a miscompare, or (b) completed testing the entire BSM without detecting any miscompare. As long as no error is encountered, the resulting BSM data is the complement of the bit pattern in expected data register 103. After any error is detected in either increment or decrement mode, the miscompare interrupt stops SV operation, and another MSF scan-in command is needed to continue the BSM testing from the address at which the miscompare was detected.

If the MSF command requests suboperation 1 with hold mode, then the group of suboperations 1 through 3 are cycled through only one line, and the resulting BSM data is the true state of the data in the expected data register 103. Another MSF scan-in command is needed to test another line in hold mode.

The automatic group of suboperations 1 through 3 using both increment and decrement modes enable the SV to test a BSM for addressing circuit errors as well as cell errors in the BSM. Since this is not obvious, the following explanation is provided to enable an understanding of how addressing circuit errors are detected. After initializing the BSM to a true bit pattern with suboperation 5, a MSF command requests suboperation 1 in increment mode. Then the automatic group will fetch each line beginning with line 0, perform the compare true test on it, then store the complement pattern in it, and finally perform the compare complement test on the line. If no miscompare occurs in the line, these tests are repeated on the next line, etc. until the highest address line is tested in this manner.

Then an MSF command is issued for suboperation 1 in decrement mode with the expected data register given a bit pattern which is the complement of the expected data register bit pattern used during the increment mode. The same automatic group of suboperations 1 through 3 is performed as before, except that the line addresses are changed in the opposite direction, i.e. decrement. If no miscompare occurs in any line in the BSM, the decrementing test stops when the lowest addressed line 0 is tested. The final pattern stored in the BSM is the same as the pattern first stored by initial suboperation 5, because the final pattern is the complement of the complement pattern, which is the original true pattern.

But suppose an addressing circuit error occurs. Then, when suboperation 3 executes on the erroneous address, it will store the complement pattern in an erroneous location other than the required location, and the erroneous location will have either a higher or lower address than the required location. Such higher or lower erroneous location may have the complement of the then-used expected pattern stored among expected patterns not yet reached in the BSM. That is, the erroneous location is detectable in the part of the BSM not yet reached in one (but not necessarily in the other) testing direction (i.e. address incrementing or decrementing). This is better understood by examining the example of a ten line BSM represented by the following table, in which T represents a true bit pattern and C represents its complementary bit pattern:

| Line No. | Initial Subop 5 | | INCREMENT | | DECREMENT | |
| --- | --- | --- | --- | --- | --- | --- |
| | | | Current Subops 1-3 | Final Subops 1-3 | Current Subops 1-3 | Final Subops 1-3 |
| 0 | T | ↓ | C | C | C | T |
| 1 | T | ↓ | C | C | T(D) | T(D) |
| 2 | T | ↓ | C | C | C | T |
| 3 | T | | T(I) | T(I) | T(I) | T(I) |
| 4 | T | | C(R) | C | C | T |
| 5 | T | | T | C | T(R) | T |
| 6 | | | T | C | C(D) | C(D) |
| 7 | T | | C(I) | C(I) | ↑ C(I) | C(I) |
| 8 | T | | T | C | ↑ T | T |
| 9 | T | | T | C | ↑ T | T |

Column 2 in the table, shows the result of suboperation 5 initializing all doublewords in all lines in the BSM to a true pattern T, e.g. 1010 . . . .

Then, the automatic group of suboperations 1 through 3 in increment mode are invoked, which begin by using true pattern T as the expected data register pattern, and leave the complement pattern C when no error occurs in a line. Column 3 in the table shows the state in the BSM when the increment mode (downward arrow) has currently reached line 4, which is marked as C(R). But, note that line 3 contains a true pattern T(I), because when a double word in line 3 was addressed a fault in the addressing circuits caused line 7 to actually be addressed, so that the resulting complement pattern is stored in line 7, represented as C(I). Note that at this time all lines after current line 4, i.e. C(R), should be in their initial T state, because they have not yet been reached by the incrementing testing process. When line 7 is reached in column 3, a miscompare must occur because the fetched complement C(I) will not compare equal with the true value in the expected data register. The resulting interrupt will cause the MSF to scan out the data in the actual and expected data registers, and later MSF comparisons of these fields will find all bits miscompare due to true being compared to its complement, which indicates an addressing failure. A cell failure in the BSM will usually affect less than all bit cells involved in the compared patterns.

Column 4 in the table illustrates the state of all BSM lines 0-9 when the incrementing operation has completed testing the highest addressed line 9. The entire BSM will then be set to the complement pattern C, except for the non-addressed pattern in line 3 which retains whatever it had previously, e.g. T(I).

Column 5 in the table represents a decrementing operation (upward arrow) using the complement pattern (C) as its suboperation 1 expected pattern. Testing begins with line 9 and currently has reached line 5, i.e. T(R). Thus from lines 9 to 5, each tested non-erroneous line is left with a true bit pattern T (i.e. complement of the complement pattern and relative to the initial pattern T provided by suboperation 5 in column 2), except for pattern C(I) in line 7 (due to the addressing error occurring in incrementing mode) and a new addressing error at C(D) in line 6 of column 5 due to an addressing circuit fault which caused the addressing circuit to then access line 1 and store the true value T(D) in line 1 when the doubleword in line 6 was attempted to be addressed. Thus far in column 5, untested lines 4 through 0 will contain the pattern C left at the end of the increment testing in column 4, except for the addressing error T(I) previously caused in line 3 and the new addressing error T(D) in line 1. These errors in lines 3 and 1 may each be detected as the testing decrements to these respective locations.

Note that addressing errors to a higher address are detected only in increment mode, and that addressing errors to a lower address are detected only in decrement mode. That is, errors can only be detected in locations which remain to be tested in any given direction of testing.

MSF Control Of The Storage Validator

The MSF controls BSM testing by inputting scan-in commands to the SV scan ring of a BSC (see FIG. 3B) to initiate a BSM and start the SV, which continues the testing and validation until the entire BSM is validated or until an error is detected causing a miscompare interrupt. An interrupt signal from the SV causes the MSF to issue a scan-out command to obtain the current results in the scan ring at the time of the last interrupt, and the scanned out results are put into the MSF storage. Then the MSF analyzes the scanned out results to formulate the next scan-in command when testing is to proceed beyond a detected erroneous double word.

In this manner, errors in a BSM are reported to the MSF service processor by the SV. The MSF determines each UE in an interrupting double word from the scan-out it receives from registers 102 and 103 when it compares their expected and actual bit positions to determine which bit position(s) are in error. Only UEs are recorded in an error table for the tested BSM in MSF storage. When all testing is completed for a BSM, the MSF analyzes the results in the BSM error table to determine the identity of which BSM array boards or modules have UE(s), and whether the UE(s) can be eliminated by swapping array boards or modules.

A BSM validation process consists of a series of test steps, defined below. Each test step is controlled by one or more MSF commands. Any double word failure within a BSM line will be detected by test step III. Failures in which a bit within a double word cannot be selected uniquely will be detected by test step IV. Cell failures within the storage will be detected by steps VI and VII. Upward addressing failures (e.g. store into line 4 affects data in line 7) will be detected by step VII. No distinction is made between cell failures and addressing failures, however, when either is isolated to an array card. Known storage errors which have not been reproduced (and thus cannot be isolated) will have extra attempts made to recreate the error in test step VIII. No specific test is included for address parity or store control check errors, but these may occur during any test step, and will cause the termination of the test.

At the completion of the BSM validation procedure due to a normal termination or an error termination, each BSM will be re-initialized such that each double word in the BSM contains zeroes with the corresponding (correct) ECC.

The BSM validation procedure performs the following test steps by MSF command control of a fenced SV:

(Step I)

The BSM is initialized with Suboperation 5 such that each double word in the BSM contains X'AAAAAAAAAAAAAAAA'. Then Suboperation 2 stores the line of complement data in the BSM, in which each double word within each line receives X'5555555555555555', wherein 5=0101. Suboperation 3 fetches the line again, and each double word in the line is compared to X'5555555555555555'. Then Suboperation 3 increments the line address by one, and this step is repeated for each line in which all double words are error free. This line is called the "strobing line".

(Step III)

The strobing line is then further validated as follows: The strobing line has each of its double words stored with X'5555555555555555', and line 0 has each double word stored with X'AAAAAAAAAAAAAAAA'. Then the first double word of the strobing line is stored with X'AAAAAAAAAAAAAAAA. The strobing line is then fetched and its first double word is compared against a double word equal to X'AAAAAAAAAAAAAAAA'. The entire procedure of this step is then repeated fifteen more times, such that the single double word of X'AAAAAAAAAAAAAAAA' appears in each double word positions of the strobing line while all other double word positions contain double words equal to X'5555555555555555. If an error is detected, a new strobing line is selected by repeating Steps I and II above, and Step III is performed on the new strobing line. If an error is detected again, the test is terminated on the line.

(Step IV)

A single one bit is "walked" through an even and an odd double word of zeroes at the strobing line used in Step III, i.e. 72 patterns are tested: B'1000...0'; B'0100 ...0'; etc. through B'000...01). If an error is detected, a new strobing line is selected, and Steps I-IV are performed on the new strobing line. If an error is detected again, the test is terminated on the line.

(Step V)

Step I is repeated, i.e. BSM initialized to all A's.

(Step VI)

Beginning at line 0 of the BSM, a line of data is fetched and each double word within the line is compared to X'AAAAAAAAAAAAAAAA'. The line of data is then stored in which each double word within the line is stored with X'5555555555555555'. The line is fetched again, and each double word in the line compared to X'5555555555555555'. Any errors detected are isolated to an array board. The line address is incremented by one and the sequence repeated until either the maximum line address in the BSM is reached, or an error threshold is exceeded, e.g. 1000 or more UE's in a BSM.

(Step VII)

Beginning at maximum line address of the BSM, Suboperation 1 is initiated in decrement mode. A line of data is fetched and each double word within the line is compared to X'5555555555555555'. A line of data is stored in which each double word within the line is stored with X'AAAAAAAAAAAAAAAA'. The line is fetched again, and each double word in the line compared to X'AAAAAAAAAAAAAAAA'. Any errors detected are isolated to the array board. The line is decremented. This step ends when either line 0 is reached, or the error threshold is exceeded.

(Step VIII)

During Steps I through IV, each failing storage address is recorded in a list in the MSF storage. Step VIII searches the list for each line in which a failure was reported by Steps I-IV, but not by Steps V, VI or VII. For each failed line, the line of data is fetched and each double word within the line is compared to X'AAAAAAAAAAAAAAAA'. Then the line is stored with double words equal to X'5555555555555555', and the line fetched again, and each double word compared to X'5555555555555555'. Each double word within the line is then set to X'AAAAAAAAAAAAAAAA'. This sequence is repeated appeoximately 32K times for each line, or in an attempt to reproduce the error.

MSF Analysis of Test Results

After a storage test is complete on each of the BSM's associated with the fenced BSC, the MSF performs analysis on the data obtained during the testing phase, and repair recommendations are generated and displayed or printed at the system console. The primary data obtained during the test are:

(1) Summary Counters—Counts of detected errors for each mimimum size easily removable unit in the BSM, e.g. array board, or module, or card, etc.

(2) Interaction Report—Records showing the interactions among array cards, boards, or modules to produce UEs and CEs (correctable errors).

(3) Error Data—Records showing all errors in main storage (UEs and CEs) which are recorded in the BSM validation test data set.

(4) State Variables—A field of flags indicating the types of errors which were detected.

In addition, the analysis includes information from previous tests of the same BSM.

SCOPE CONTROL BY SV

It is useful to be able to provide an oscilloscope display of the control signals any particular BSM.

Figure 5A:
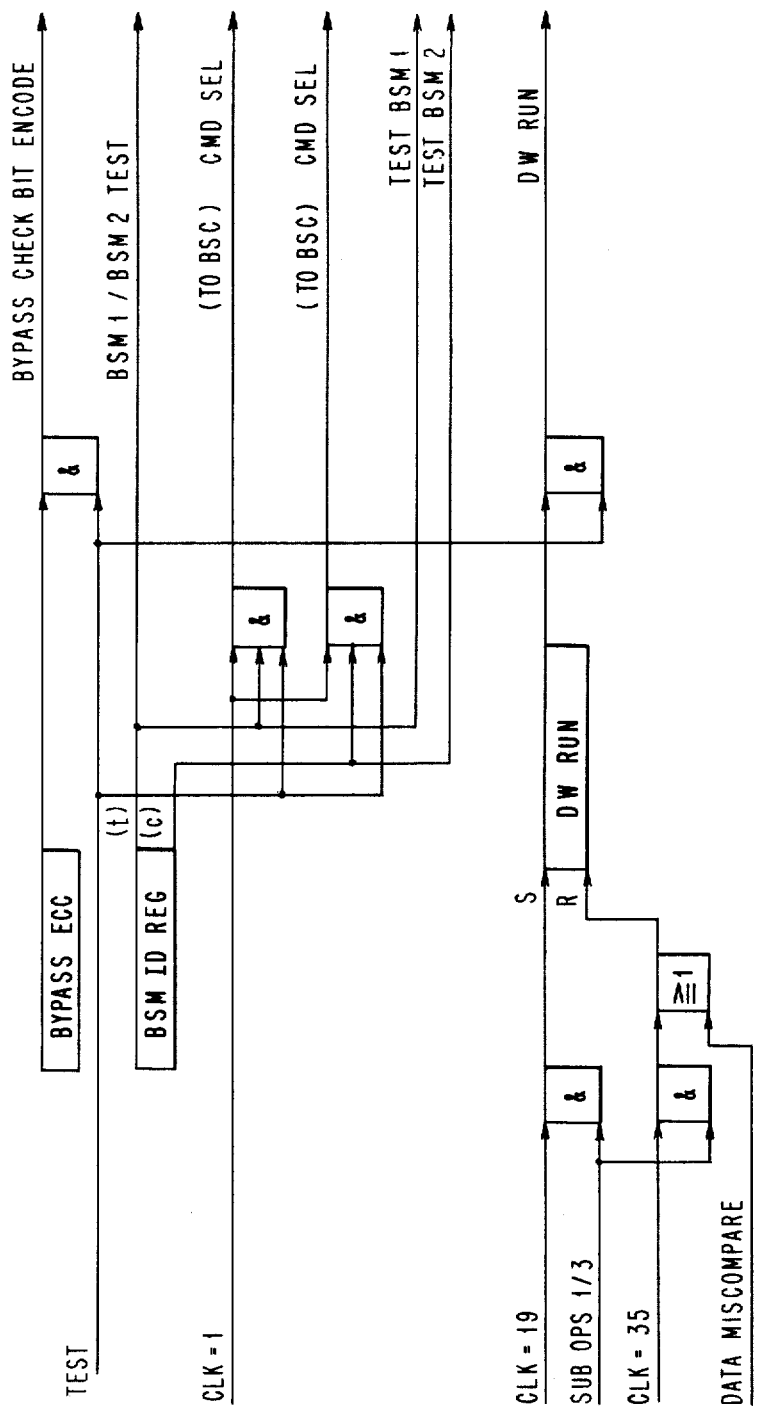
Figure 5B:
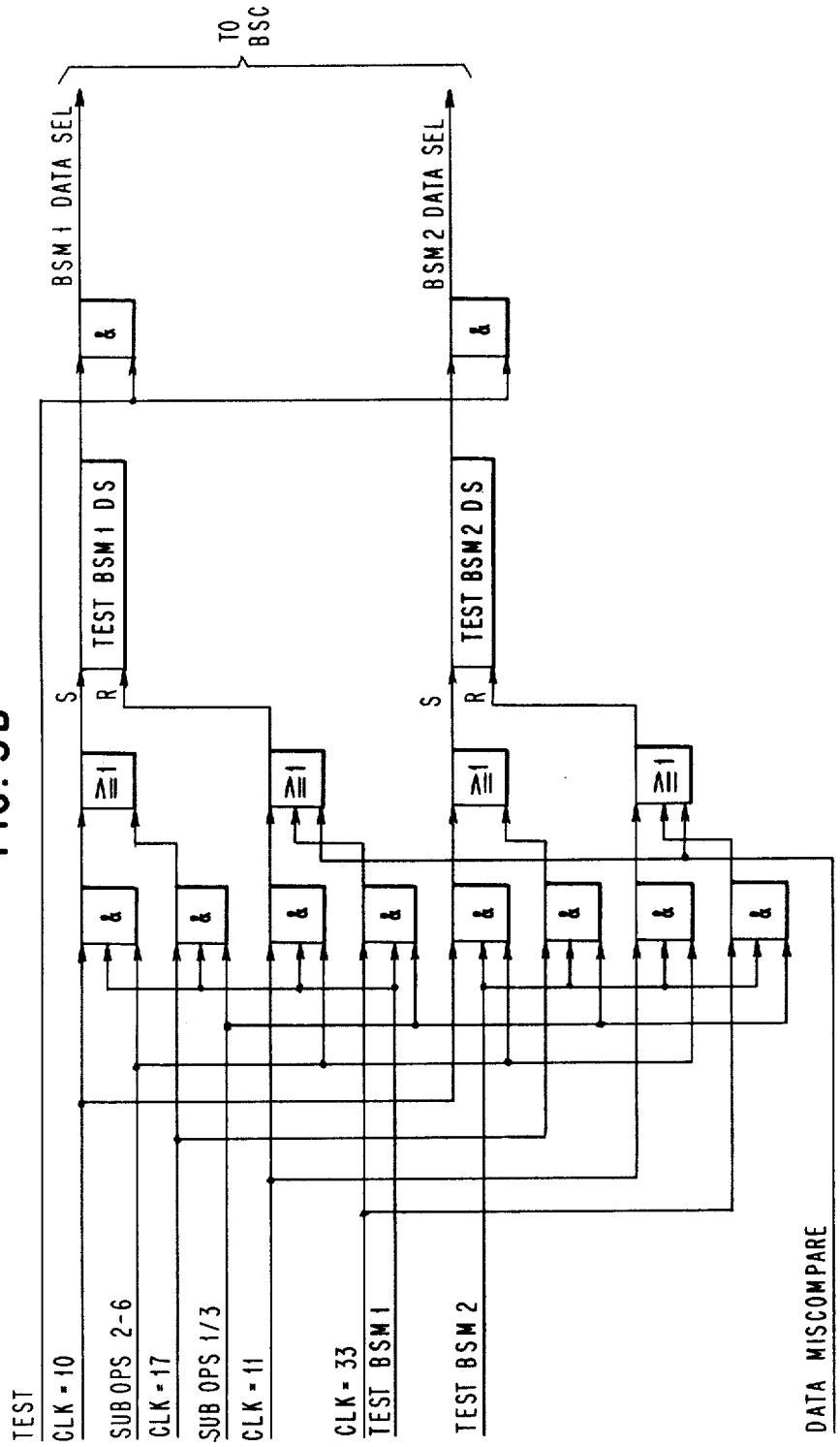
Figure 5C:
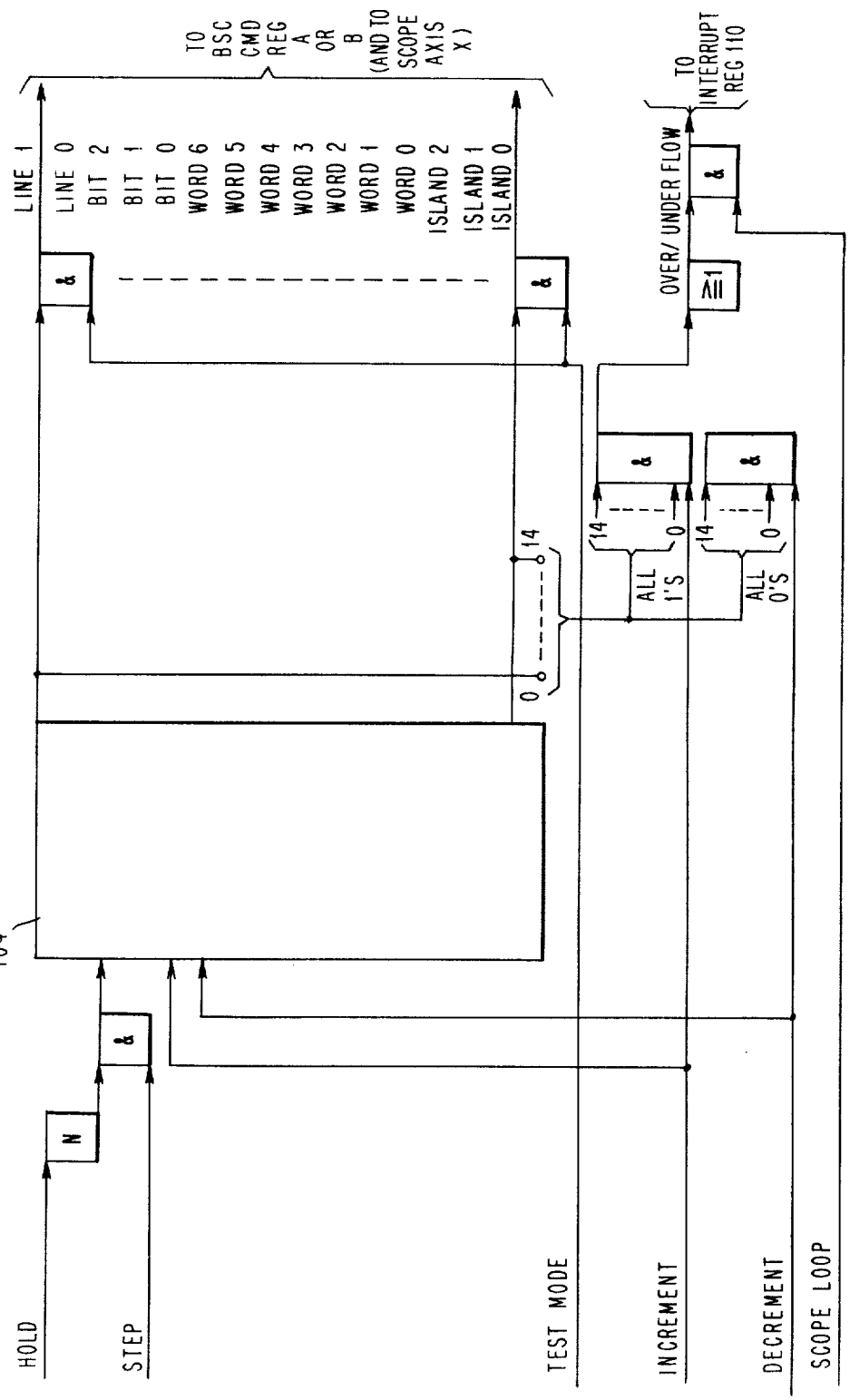
Figure 5D:
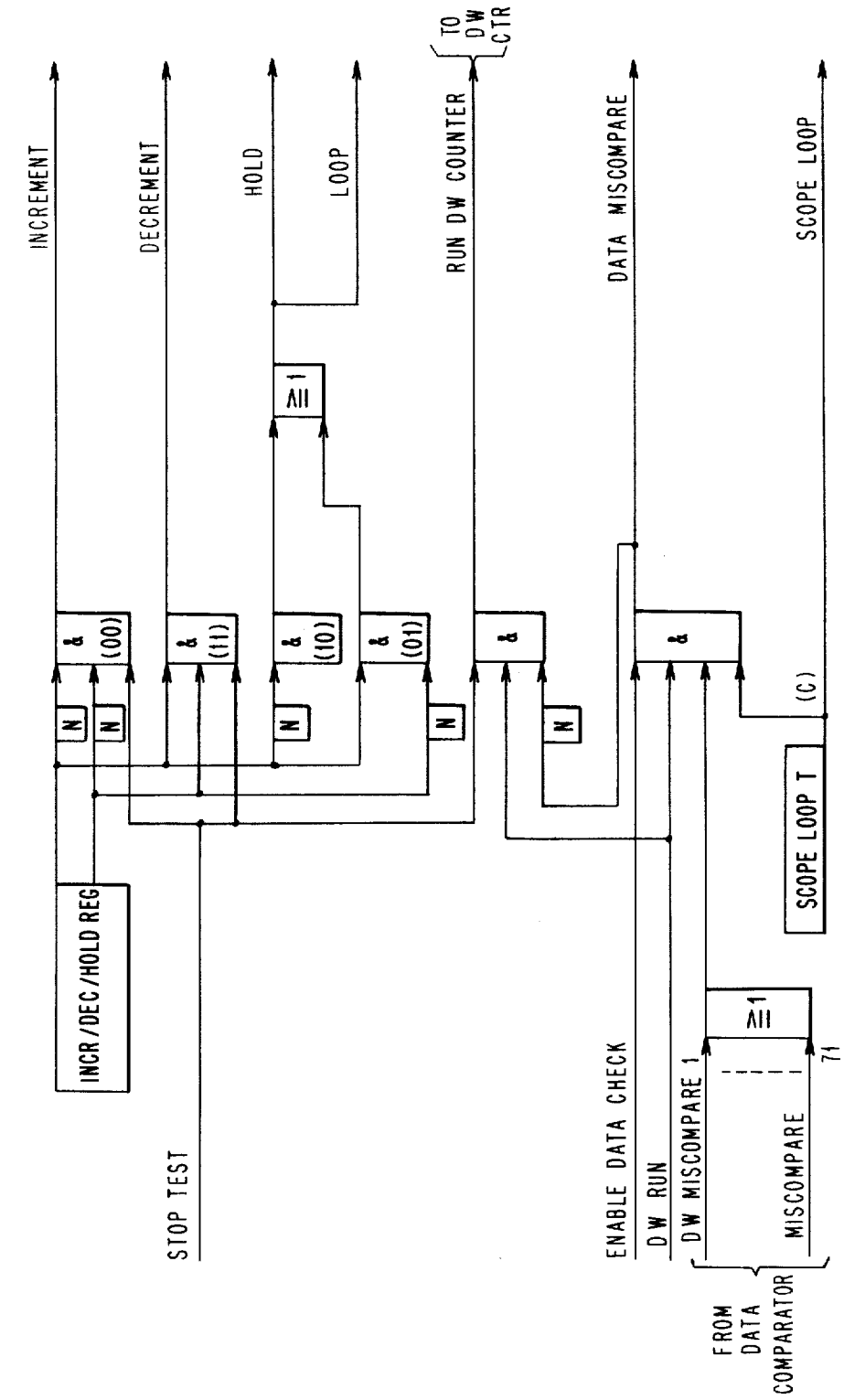
Figure 5F:
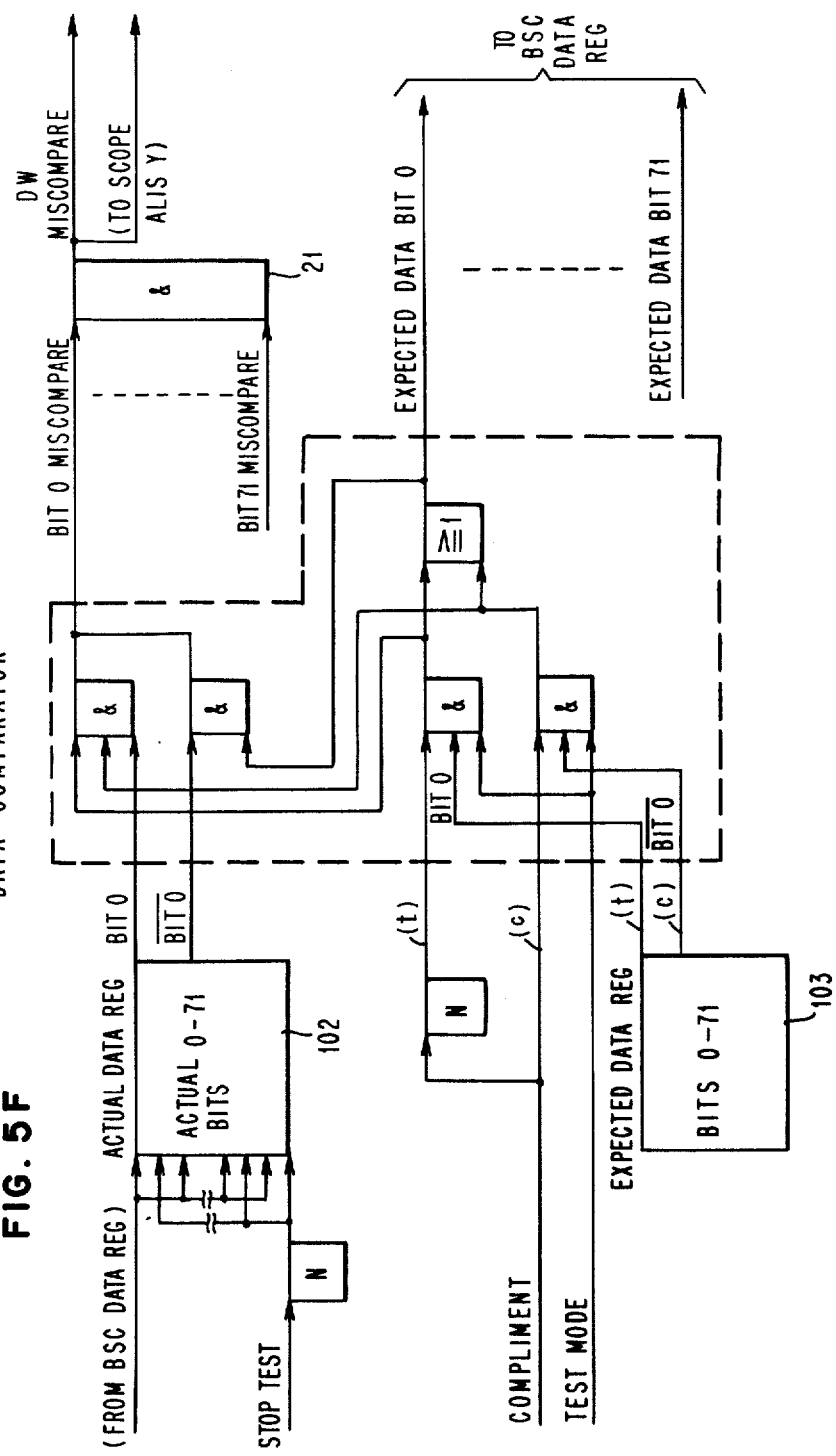
Figure 5G:
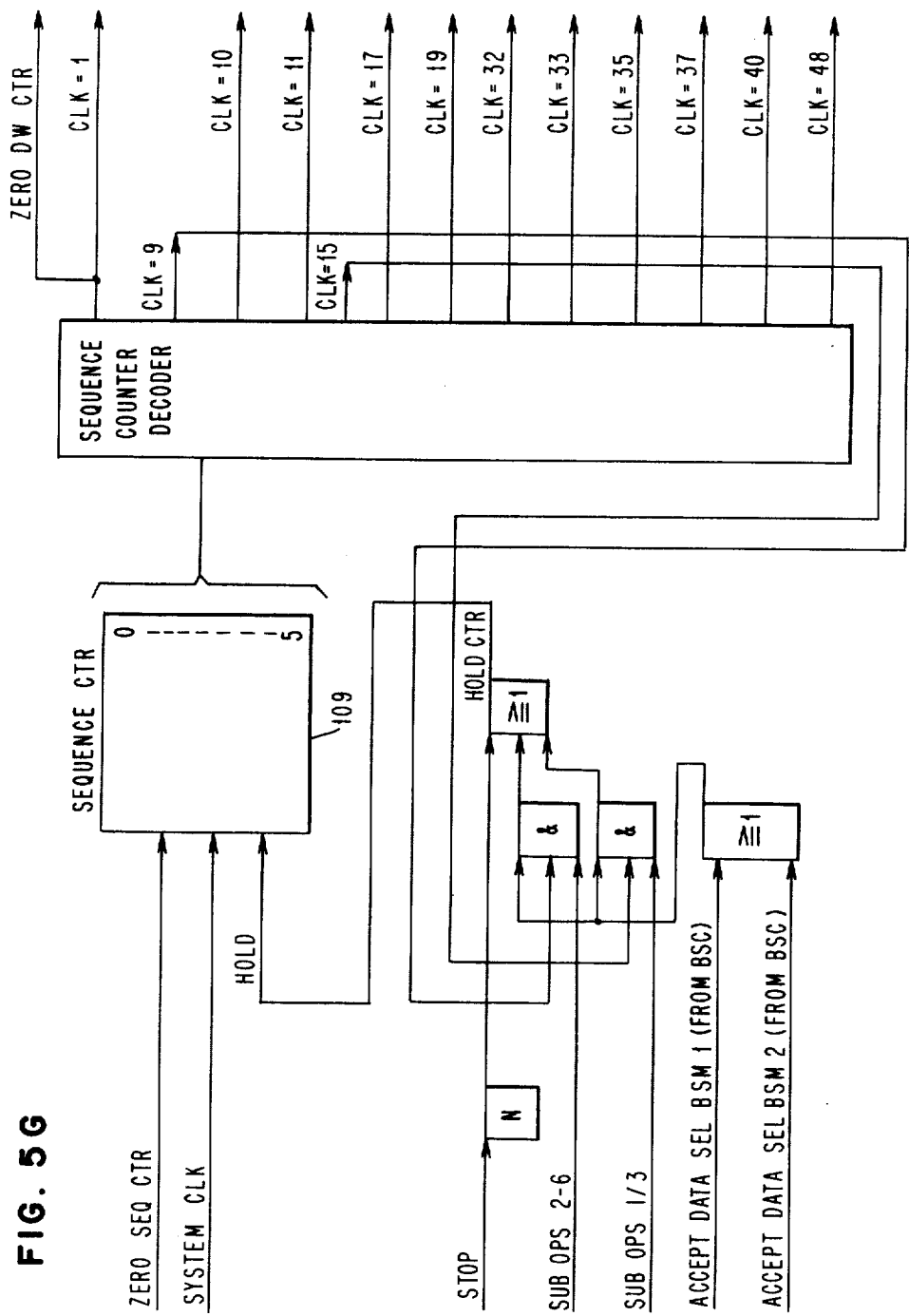
Figure 5I:
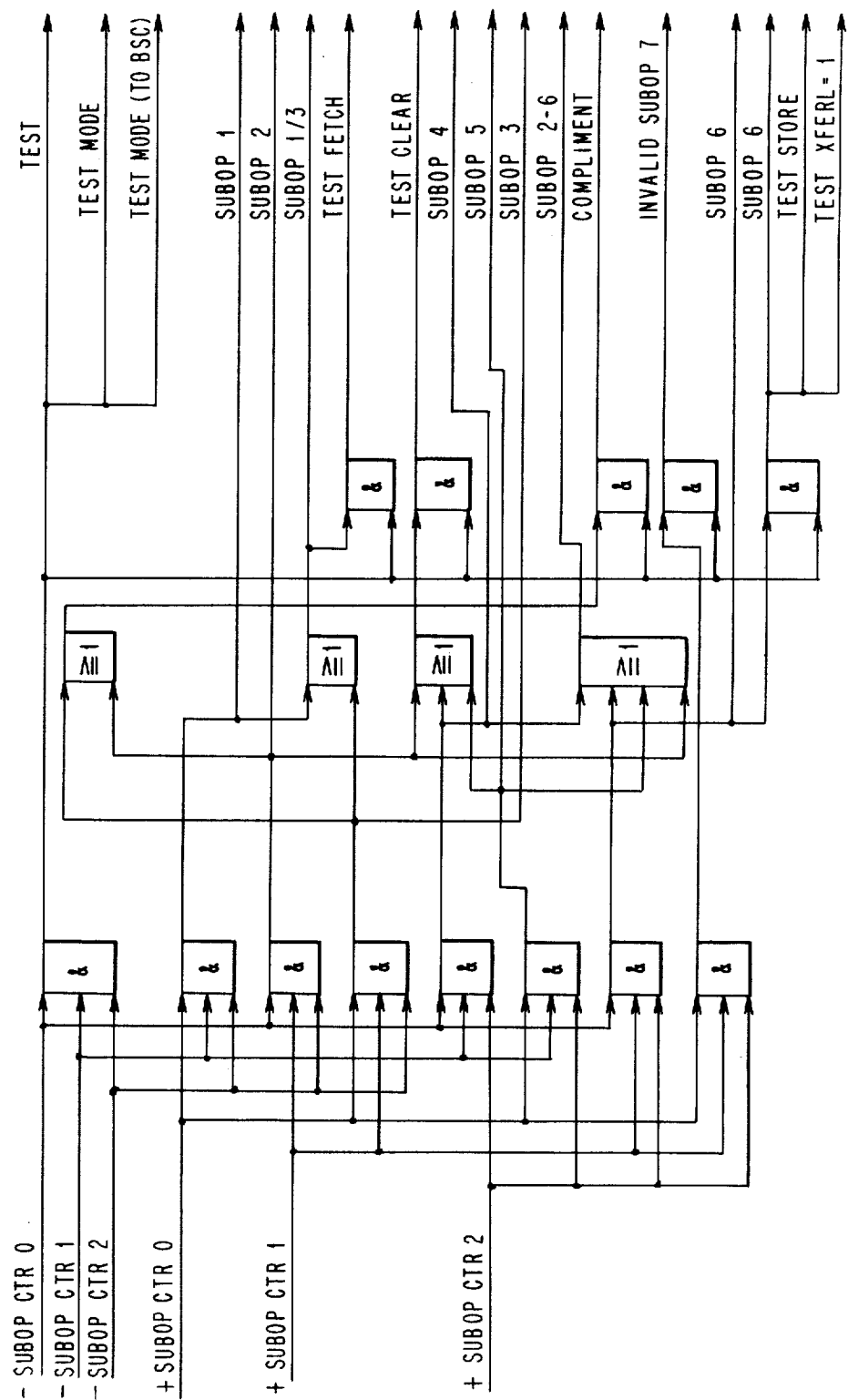
Figure 5J:
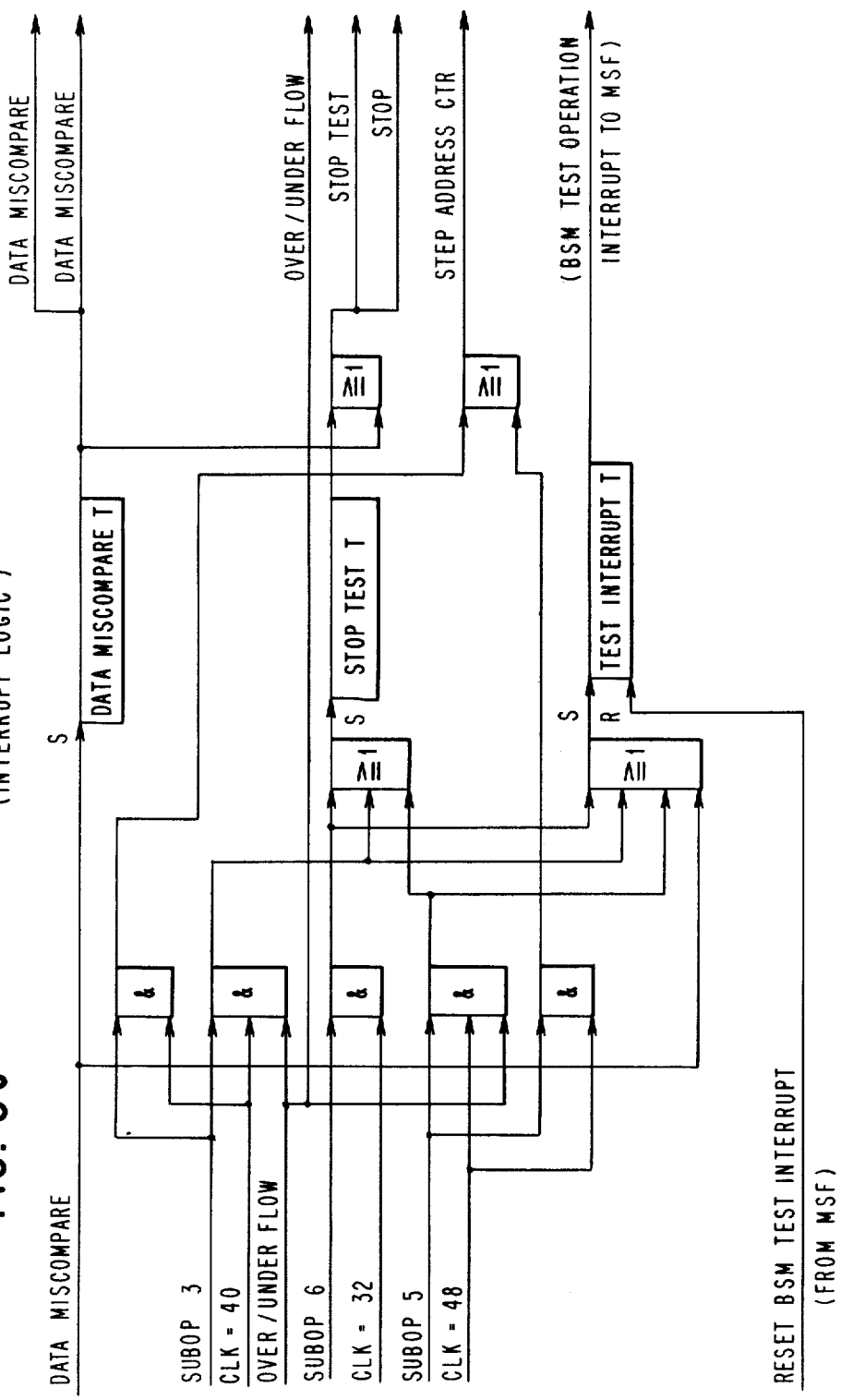

The SV can provide a loop for the purpose of obtaining an oscilloscope display of any signal waveform to or from the BSM in the system when the MSF selects the BSM and sets the scope loop trigger T in FIG. 5D by an MSF scan-in command (FIGS. 6A and 6B) providing a one bit in bit position 184 of the input format. Also the increment or decrement mode is set into field 107. The complement output of the scope loop trigger disables the data miscompare line in FIG. 5D and the overflow-/underflow interrupt control in FIG. 5C, so that the SV continuously increments the line DW address without stopping for either a data miscompare or when the highest or lowest BSM address is reached, after which the addresses recycle.

FIGS. 7A and 7B illustrate one way in which the marker mask operates in the subject invention. FIG. 7A illustrates an example of where a double word (DW) miscompare (FIG. 3A or 5F) occurs for DW 3 of a current line n. Initially marker register 105 is set to zero which enables output gate 22 of data compare circuit 21 to provide any miscompare output to set the stop test and test interrupt triggers in interrupt register 110, which provides an interrupt signal through OR circuit 23 to the MSF. The storage validator operation is then stopped at this double word address by the stop test trigger output deactivating a run DW counter line to the DW counter 106 which then retains the address of the erroneous DW. The MSF then responds with a scan-out command requesting the scan ring to output its content as defined in the output format shown in FIG. 6C. The MSF stores the received data in its storage for later processing. Then the MSF generates a scan-in command in which its marker bits 162 through 165 (FIG. 6A) define the value 3, which is set into the DW marker mask register 105 representing the third double word in the line which was found to cause the miscompare. The scan-in command will have its other fields the same as in the original command to the same line address. As a result, the SV will fetch the line and will begin scanning the line from the first double word of the line but gate 22 at the output of data comparator 21 will then be disabled by the DW marker logic 24 in FIG. 3A until it detects that the DW address has passed the third double word indicated by the current content of the double word marker mask register 105. Thereafter, gate 22 is enabled, so that the effective DW address for the new command begins with the fourth word in the line and goes to the end of the line (assuming no DW miscompare is generated).

After the MSF has transmitted the scan-in command, it can then process the received scan-out data by comparing the received actual and expected data fields to determine the precise positions of the one or more bit positions in error in the third double word. The MSF can then determine the precise bit positions of the erroneous bits for each doubleword found to have an error, and it can mark each such double word as a UE when it has more than one erroneous bit or as having a CE (correctable error) if it has only a single erroneous bit.

Figure 8:
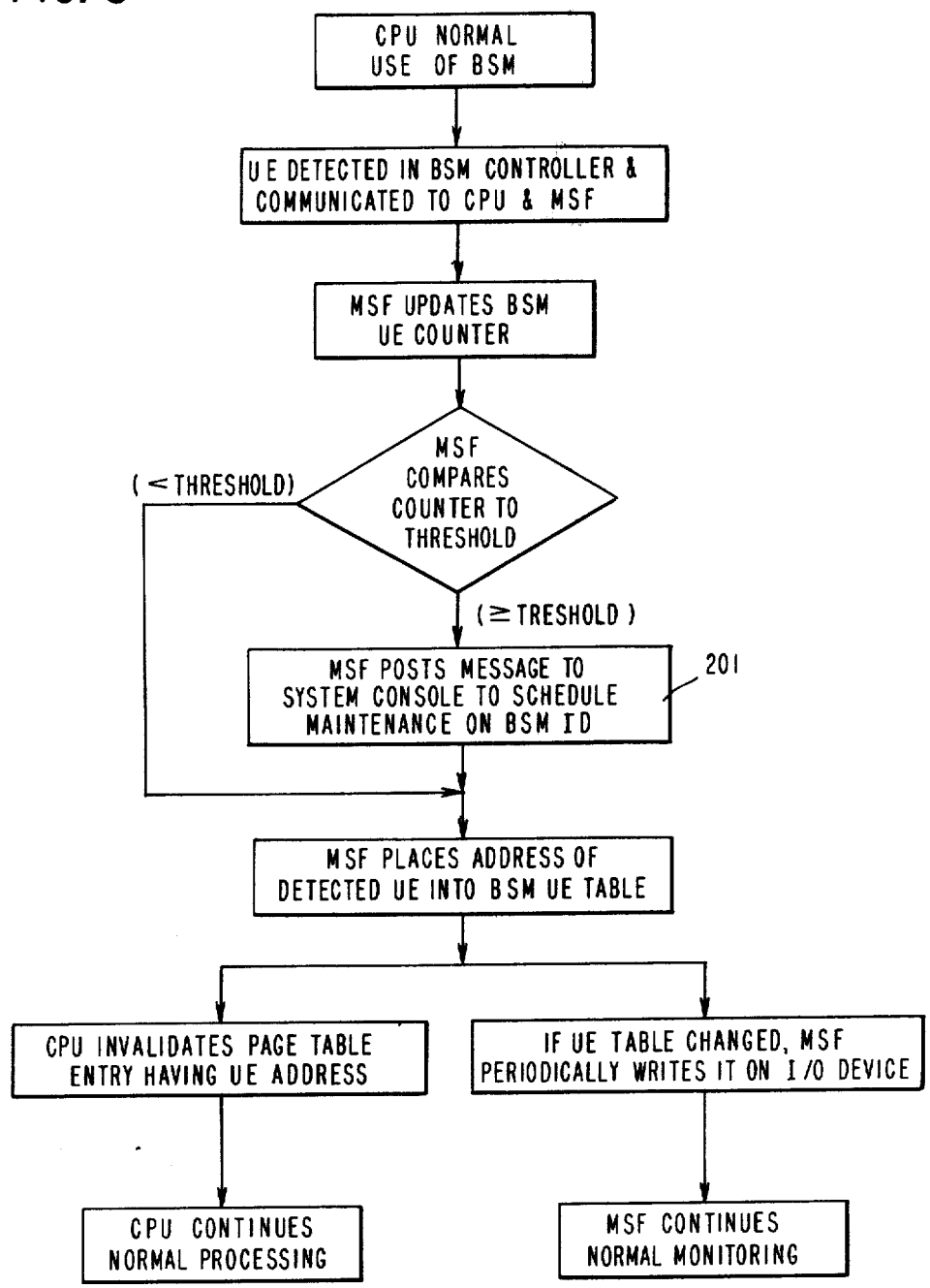
FIG. 8 is a flow diagram of a system process which determines when the maintenance procedure in FIG. 9 is to be initiated.

FIG. 8 describes the manner in which the data processing system operates in order to determine when the subject invention is to be used. Whenever during the normal operation of the system a UE is detected in any BSM, the conventional error detecting hardware in main storage generates a machine check interrupt which is processed by a CPU. The error information is communicated by the CPU to a conventional recovery management program and also is communicated to the MSF. The MSF maintains a UE counter for each BSM in the system, and when it receives a signal from a CPU that a UE has occurred in an identified BSM, it increments that counter by 1 for the referenced BSM. Then the MSF compares the current value of the BSM counter to a UE threshold value (e.g. 1000) to determine if the number of UE's for a given BSM has exceeded the threshold. If the threshold is exceeded, the MSF step 201 in FIG. 8 posts a message on the system console for the system operator to schedule maintenance on the identified BSM. Then, whether or not the threshold has been exceeded, the MSF places the address of the detected UE into the BSM error table. The CPU uses the UE information to invalidate the content of page table entry having the UE address and assign a different page frame to the page table entry. Then the information in the erroneous page frame is again obtained from an I/O device and put into the newly assigned page frame which is to replace the erroneous page frame, the program is checkpointed, and it is restarted to continue its normal processing without error in the substituted page frame.

The MSF periodically examines each BSM error table to determine if it has been recently changed, and if so the MSF writes the table onto an I/O device as storage backup and then continues with its normal monitoring functions.

Figure 9:
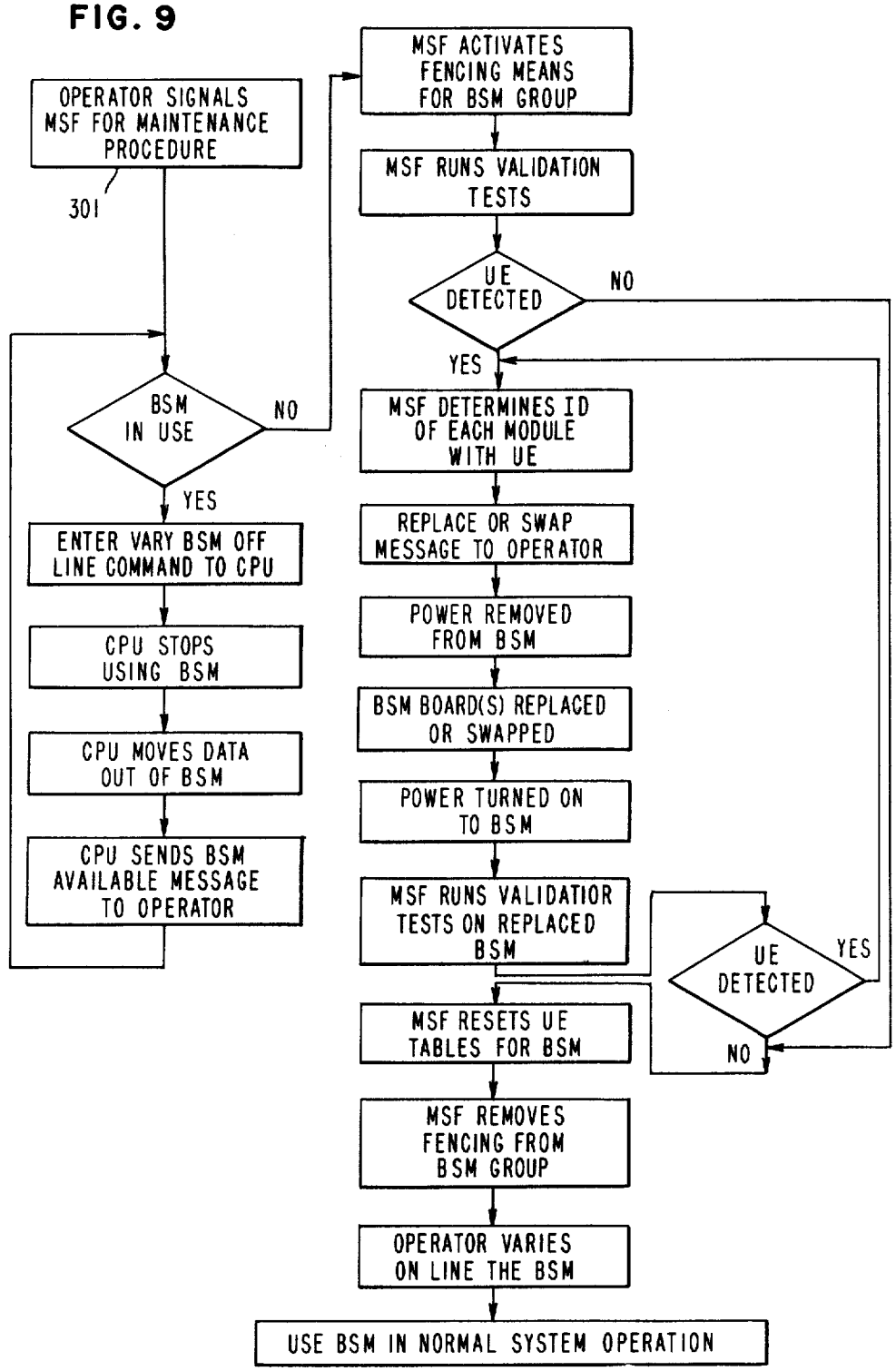
FIG. 9 is a flow diagram of a maintenance procedure which includes the operation of the subject invention.

FIG. 9 illustrates the procedure which is used after step 201 in FIG. 8 causes the MSF to post a message to the system console for scheduled maintenance on an identified BSM. Usually the operator will schedule the maintenance when it is least disturbing to system operations, such as during weekend or night time hours when the system is not being used or has minimal use. At step 301 in FIG. 9, the operator begins the maintenance procedure by inputting a command to the MSF to determine if the BSM is in use when the system can continue to run without the BSM to receive the scheduled maintenance.

The MSF determines if the BSM is in use by testing the machine configuration table in the MSF. If it is in use, then a vary BSM off-line command is entered into the CPU, so that the CPU will stop using the BSM and move the valid data in the BSM to another BSM if available or if not available to I/O. The CPU sends a message to the operator at the system console when the BSM is available, and then the BSM is tested again by the MSF to determine if it is in use and if it is not in use, the MSF activates the fencing means for the BSC controlling the BSM identified to have the erroneous condition. Then the MSF runs the previously described validation tests using the SV on the identified BSM. In this manner the MSF uses the SV to confirm the BSM errors previously detected by the BSM ECC circuits. Then if the UEs are detected under MSF control, the MSF will determine the ID of each module containing a UE and then will print a message to the operator either to replace the erroneous array boards or modules, or to swap boards or modules within the BSM in a manner which will eliminate the UEs. A board or module swap can eliminate UEs if the location of the bit positions in error are such that swapping will move around the locations of the erroneous bits in a manner that no DW will contain more than one erroneous bit so that all errors are correctable. In this manner, swapping can eliminate UEs. If the UEs cannot be eliminated by swapping, then the board(s) or module(s) must be replaced if all page frames within the BSM are to be made useable. Then electric power is turned off to the BSM to be repaired, e.g. by opening the appropriate switch controller 2 or 3 in FIG. 1. After the repair is completed, power is turned on to the BSM and the MSF again runs the validation tests on the repaired BSM to determine if the BSM is error free. If any error is detected; a printout recommends the repair action, and the above steps are repeated to perform the repair. If there is no UE detected, as would then be expected, then the MSF resets the UE tables and counters for that BSM, removes the fencing from the BSM group and the operator varies on line the BSM so that it is returned to normal operation in the system.

While the invention has been particularly shown and described with references to a preferred embodiment thereof, it will be understood by those skilled in the art that the foregoing and other changes in form and details may be made therein without departing from the spirit and scope of the invention.

Having thus described our invention, what we claim as new and desire to secure by Letters Patent is:

1. A main storage validation means for a data processing system having at least one central processor (CPU), a main storage having a plurality of basic system modules (BSMs) arranged in sets with at least one BSM being in each set, and a console having a service processor, comprising a plurality of fencing means connected to the CPU interfaces of the respective BSM sets for operationally disconnecting any BSM set from the CPU without affecting the operation of the CPU with any other BSM set in the system;

a plurality of BSM validation means, each BSM validation means being associated with a respective BSM set for testing any BSM in the respective BSM set, means connecting the service processor to the fencing means of each BSM set to permit the service processor to isolate any BSM set operationally from the CPU;

and means for receiving commands from the service processor with each BSM validation means to control a test of a BSM in the selected set; and whereby the service processor can control a test of any BSM isolated by the fencing means without disrupting the operation of the data processing system.

2. A main storage validation means as defined in claim 1, further comprising a BSM controller respectively associated with a BSM validation means and a BSM set, data and command busses in the BSM controller being connected to data and command busses of the BSM validation means.

3. A main storage validation means as defined in claim 2, in which each fencing means further comprises
a fencing trigger means associated with each validator means and its BSM controller,
a fencing gate serially connected to all data and command busses between the BSM controller and each CPU,
the output of the fencing trigger means enabling and disabling the fencing gate according to reset and set states, respectively, of the fencing trigger means,
whereby the validation means can communicate with the data and command busses in the BSM controller when the CPU signals are disabled to the BSM controller by the fencing gate.

4. A main storage validation means as defined in claim 3, further comprising
means connecting set and reset inputs of each fencing trigger means to the service processor,
whereby the service processor controls the operation of the fencing means for each BSM set.

5. A main storage validation means as defined in claim 1, in which the validation means further comprises
a BSM identifier register, an expected data register, and an actual data register,
BSM controller means connecting the expected data register and the actual data register to a BSM identified in the BSM identifier register for writing into the BSM the bits in the expected data register and for reading bits from the BSM into the actual data register,
address registering means for containing an address being accessed in the BSM by the expected and actual data registers,
comparing means connected to outputs of the expected and actual data registers to determine if the bits in the actual register are the same as the bits in the expected data register, a miscompare output being provided from the comparing means, and
interrupt signalling means connected to the miscompare output to signal any unequal bit comparison to the service processor upon the occurrence of a miscompare signal from the miscompare output.

6. A main storage validation means as defined in claim 5, further comprising
means for stopping the address registering means, the stopping means being connected to the interrupt signalling means to stop the addressing means from incrementing or decrementing when a miscompare output is provided by the comparing means,
whereby the validation means operates independently of the service processor from the time the validation means receives a command to the time of operation by the stopping means.

7. A main storage validation means as defined in claim 5, further comprising
underflow/overflow means having an output for signalling when the address registering means has accessed the highest or lowest address in the BSM, the output being connected to an interrupt signal line to the service processor to signal when a test of the BSM is completed.

8. A main storage validation means as defined in claim 7, further comprising means connecting the underflow/overflow means to the stopping means to stop the addressing means from incrementing or decrementing when the highest or lowest address in the BSM is accessed.

9. A main storage validation means as defined in claim 6, further comprising
a marker mask register for containing a mask address in the BSM, and
means for inputting a mask address into the marker mask register in response to a signal from the interrupt signalling means.

10. A main storage validation means as defined in claim 9, further comprising
means for connecting an input of the marker mask register to the service processor,
whereby a service processor command sets the mask address at which effective testing of the BSM begins after operation of a command is interrupted by occurrence of a miscompare signal.

11. A main storage validation means as defined in claim 5, the address registering means further comprising
a line address register for addressing a line of double words in the BSM identified in the BSM identifier register, a line data register receiving in parallel all bits in a line being fetched,
a double word counter for addressing any double word in the line contained in the line data register, and
a sequence counter for clocking operations of the storage validation means.

12. A main storage validation means as defined in claim 6, further comprising
a direction mode register for indicating the direction of addressing by the address registering means,
whereby the direction mode register may be set to control address incrementing, decrementing or holding of an address value by the address registering means to aid in the detection of addressing errors.

13. A main storage validation means as defined in claim 12, further comprising
a suboperation counter to register each suboperation to be performed by the validation means, one state of the suboperation counter operationally disconnecting the validation means from all BSMs in the associated BSM set, and other states of the suboperation counter operationally connecting the validation means to the BSM identified in the BSM identifier register to control different types of tests defined by different contents of the suboperation register.

14. A main storage validation means as defined in claim 13, further comprising
a suboperation decoder to decode the state in the suboperation counter to control the suboperation to be performed by the validation means,
suboperation logic circuits to increment the suboperation counter through a predetermined sequence of states determined by an initial setting of the suboperation counter.

15. A main storage validation means as defined in claim 12, the suboperation logic circuits further comprising
a suboperation counter to register each suboperation to be performed by the validation means,
means for sequencing the suboperation counter to a plurality of states to perform different functions in the validation means.

16. A main storage validation means as defined in claim 15, further comprising suboperation decoding circuits sensing the states of the suboperation counter and the state of the direction mode register to control a predetermined group of suboperations of the validation means, including means to compare a first expected bit pattern with an actually read bit pattern of each unit read in the BSM, means to store the complement of the first expected bit pattern in each unit after the unit is read and compared by the comparing means, means to increment the address in the BSM after each complement of the first bit pattern is stored by the storing means, means for detecting when one addressing end of the BSM is reached and to change the state of the direction mode register to decrement the addressing of the BSM, means for providing a second expected bit pattern which is the complement of the first expected bit pattern, the comparing means comparing the second expected bit pattern with an actually read bit pattern of each unit read in the BSM, the storing means storing the complement of the second expected bit pattern in each unit after the unit is read and compared by the comparing means, means to decrement the address in the BSM after each complemented second bit pattern is stored by the storing means, the detecting means detecting when another addressing end of the BSM is reached, whereby forward and backward addressing errors are detected by the comparing means miscomparing the expected bit pattern with a read bit pattern which may be the complement of the expected bit pattern in either direction of addressing the BSM.

17. A main storage validation means as defined in claim 14, further comprising level sensitive scan design (LSSD) technology circuits being used to construct and serially connect to a command scan-in/scan-out line from the service processor the BSM identifier register, the address registering means, the marker mask register, the direction mode register, the suboperation counter, the expected data register and the actual data register, whereby the counter and registers can transmit signals and receive signals on the command scan-in/scan-out line under control of the service processor to test a BSM not constructed of LSSD technology.

18. A main storage validation means as defined in claim 17, further comprising a scope loop trigger being provided in LSSD technology and being connected serially with the counter and registers, the scope loop trigger for being set and reset by service processor command, means for disabling all signals for stopping the incrementing or decrementing of the address register means, the disabling means being connected to the output of the scope loop trigger, whereby the address registering means continuously cycles through the BSM addresses regardless of any miscompare output from the comparing means or any output from the underflow/overflow means.

19. A main storage validation means as defined in claim 18, in which each BSM set includes two BSMs connected to a single BSM controller, fencing means and validation means being integral with the BSM controller, whereby the fencing means isolates the BSM controller and its two BSMs from normal system operation and the validation means can test either of the two BSMs.

20. A main storage validation means as defined in claim 16, in which the unit is defined as an ECC unit in the BSM.

21. An automatic method for a service processor to determine when maintenance should be performed on any of plural BSMs in a main storage of a data processing system having a central processor (CPU) and a service processor, comprising detecting an uncorrectable error (UE) in a BSM using error detection hardware in the BSM, interrupt signalling to the CPU and to the service processor the occurrence of a UE and the identity of the BSM having the UE, providing a BSM counting means in the service processor for maintaining a count of the detected UEs in each BSM, incrementing the BSM counting means identified by the interrupt signalling step to obtain the current UE count for each BSM, comparing a threshold count value in the service processor to the count in the BSM counting means incremented by the interrupt signalling means, and generating a threshold-exceeded output identifying each BSM which exceeds the threshold, whereby the threshold-exceeded output indicates that a BSM should be replaced or repaired.

22. A method for maintaining BSMs in the main storage of a data processing system having at least one central processor (CPU) and a service processor, including the method in claim 21, comprising varying off-line a BSM identified by the threshold-exceeded output to determine if the BSM should be replaced or repaired, moving errorless and error-corrected data out of the BSM to another BSM or to I/O, fencing the BSM by fencing means in a BSM controller connected to the BSM, the fencing means being activated by the service processor for operationally isolating the BSM and its BSM controller from other parts of the system after the BSM has been varied off-line, exercising every cell in the BSM a plurality of times by hardware validation means contained within the BSM controller and controlled by the service processor to verify UEs in the BSM and to validate error free and correctable areas in the BSM, outputting the identity of each field replacement part of the BSM having a UE in the BSM determined by the exercising step, removing electrical power to the BSM, and replacing or swapping at least the field replaceable part identified by the outputting step.

* * * * *